United States Patent
Isobe et al.

(10) Patent No.: US 7,505,314 B2
(45) Date of Patent: Mar. 17, 2009

(54) SEMICONDUCTOR STORAGE DEVICE PROVIDED WITH MEMORY CELL HAVING CHARGE ACCUMULATION LAYER AND CONTROL GATE

(75) Inventors: Katsuaki Isobe, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/770,199

(22) Filed: Jun. 28, 2007

(65) Prior Publication Data

US 2008/0043528 A1   Feb. 21, 2008

(30) Foreign Application Priority Data

Jun. 29, 2006   (JP) ............................. 2006-179836

(51) Int. Cl.
    *G11C 11/34*   (2006.01)
(52) U.S. Cl. .............................. 365/185.03; 365/185.24
(58) Field of Classification Search ............ 365/185.03, 365/185.24, 185.17
    See application file for complete search history.

(56) References Cited

U.S. PATENT DOCUMENTS

| | | | |
|---|---|---|---|
| 6,064,611 A | 5/2000 | Tanaka et al. | |
| 6,314,026 B1 * | 11/2001 | Satoh et al. | 365/185.24 |
| 6,331,945 B1 * | 12/2001 | Shibata et al. | 365/185.03 |
| 7,420,841 B2 * | 9/2008 | Ruf et al. | 365/185.09 |
| 2002/0008990 A1 * | 1/2002 | Satoh et al. | 365/185.03 |
| 2008/0043528 A1 | 2/2008 | Isobe et al. | |

FOREIGN PATENT DOCUMENTS

| | | |
|---|---|---|
| JP | 10-283788 | 10/1998 |
| KR | 10-2005-0108148 | 11/2005 |

OTHER PUBLICATIONS

U.S. Appl. No. 12/058,356, filed Mar. 28, 2008, Abiko et al.

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes memory cell transistors, a first selection transistor, and word lines. Each of the memory cell transistors has a stacked gate including a charge accumulation layer and a control gate, and is configured to retain at least two levels of "0" data and "1" data according to a threshold voltage. The threshold voltage corresponding to the "0" data being the lowest threshold voltage in the levels retained by each of the memory cell transistors. The first selection transistor has a current path connected in series to one of the memory cell transistors. Each of the word lines is connected to the control gate of one of the memory cell transistors. upper limit values of threshold voltages of the memory cell transistors retaining the "0" data being different from one another in each word line.

16 Claims, 36 Drawing Sheets

NAND-type flash memory

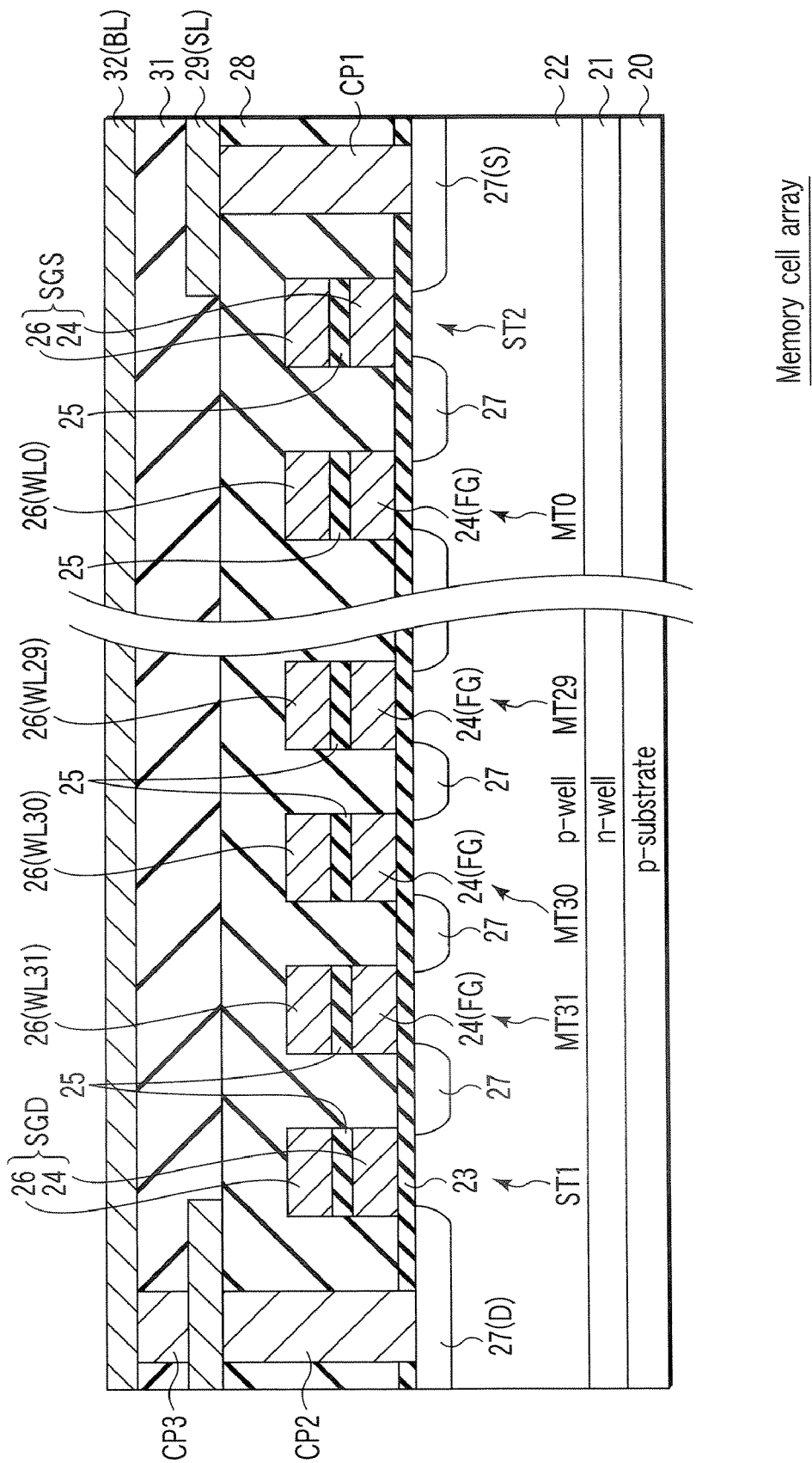
F I G. 3

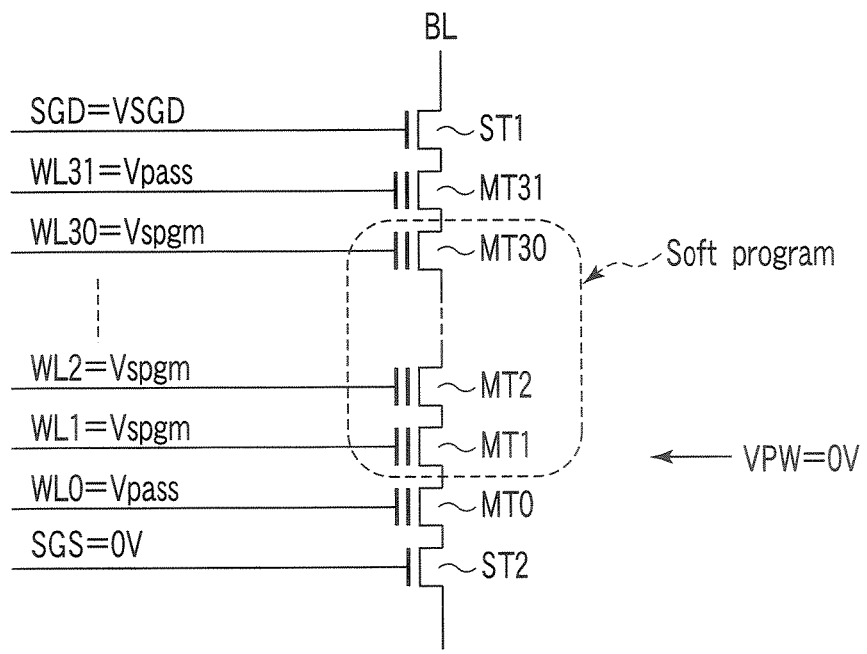
F I G. 11　First soft program
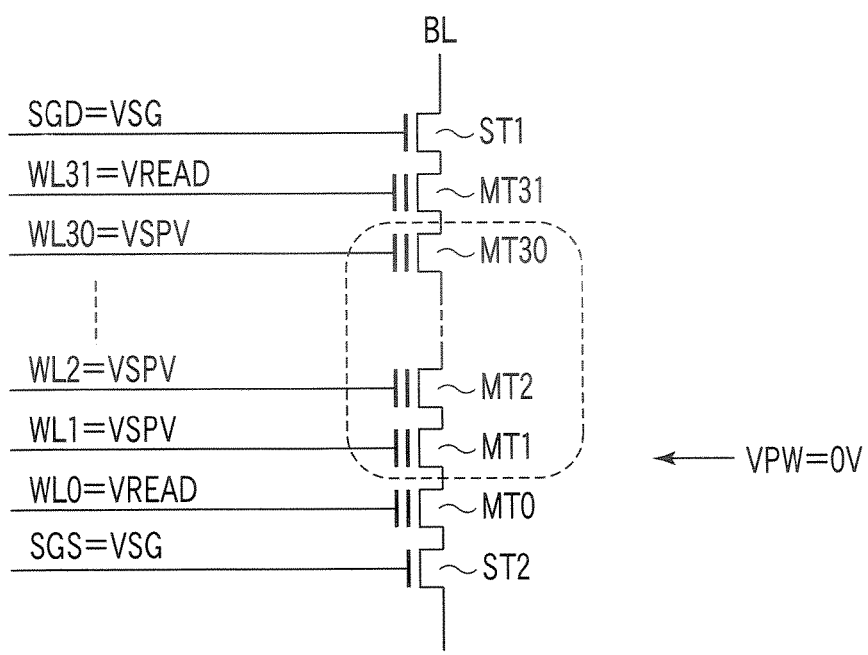
F I G. 12　First verification

Second soft program

Second verification

Third soft program

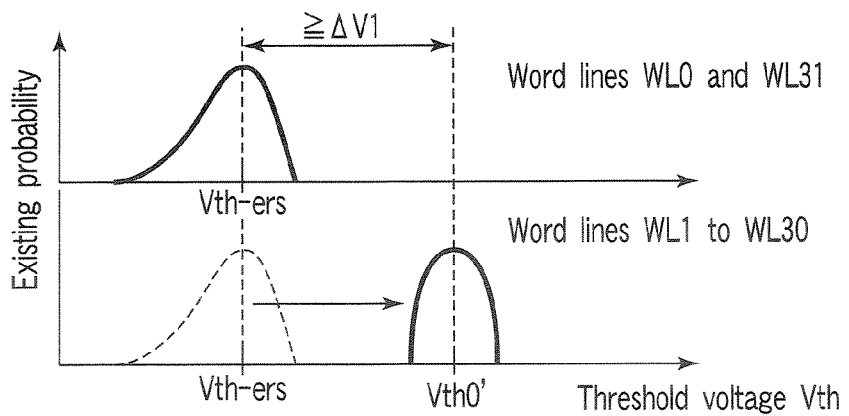
F I G. 25
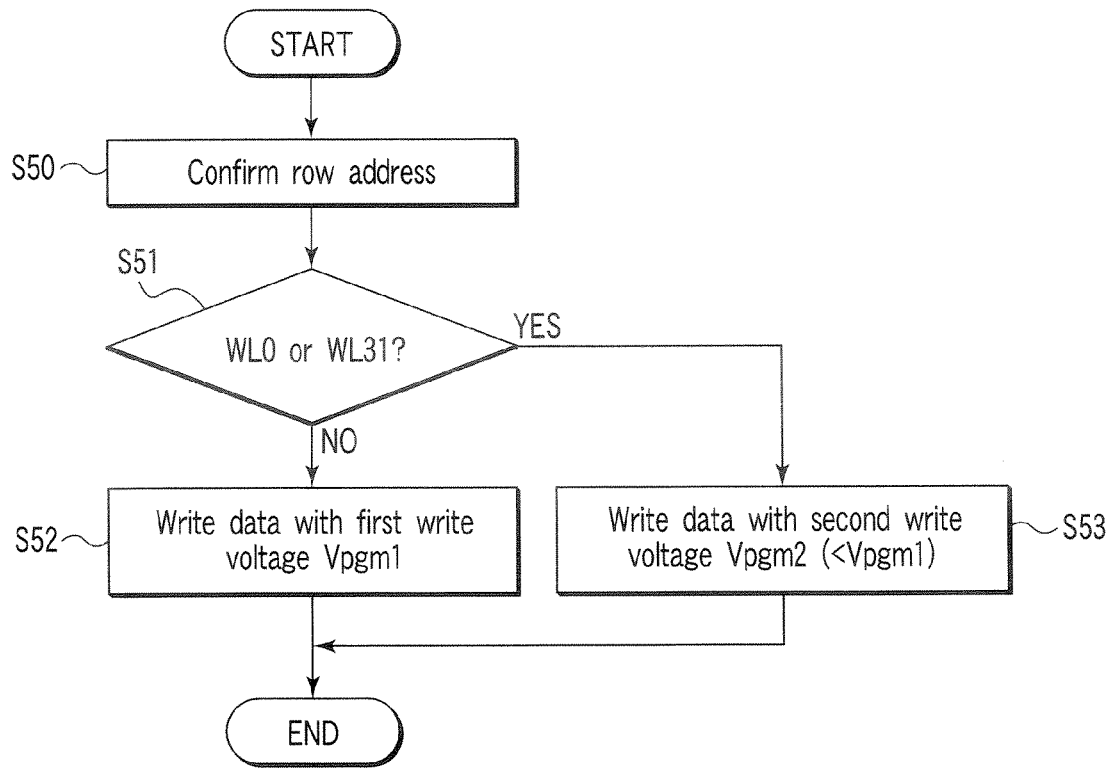
F I G. 26

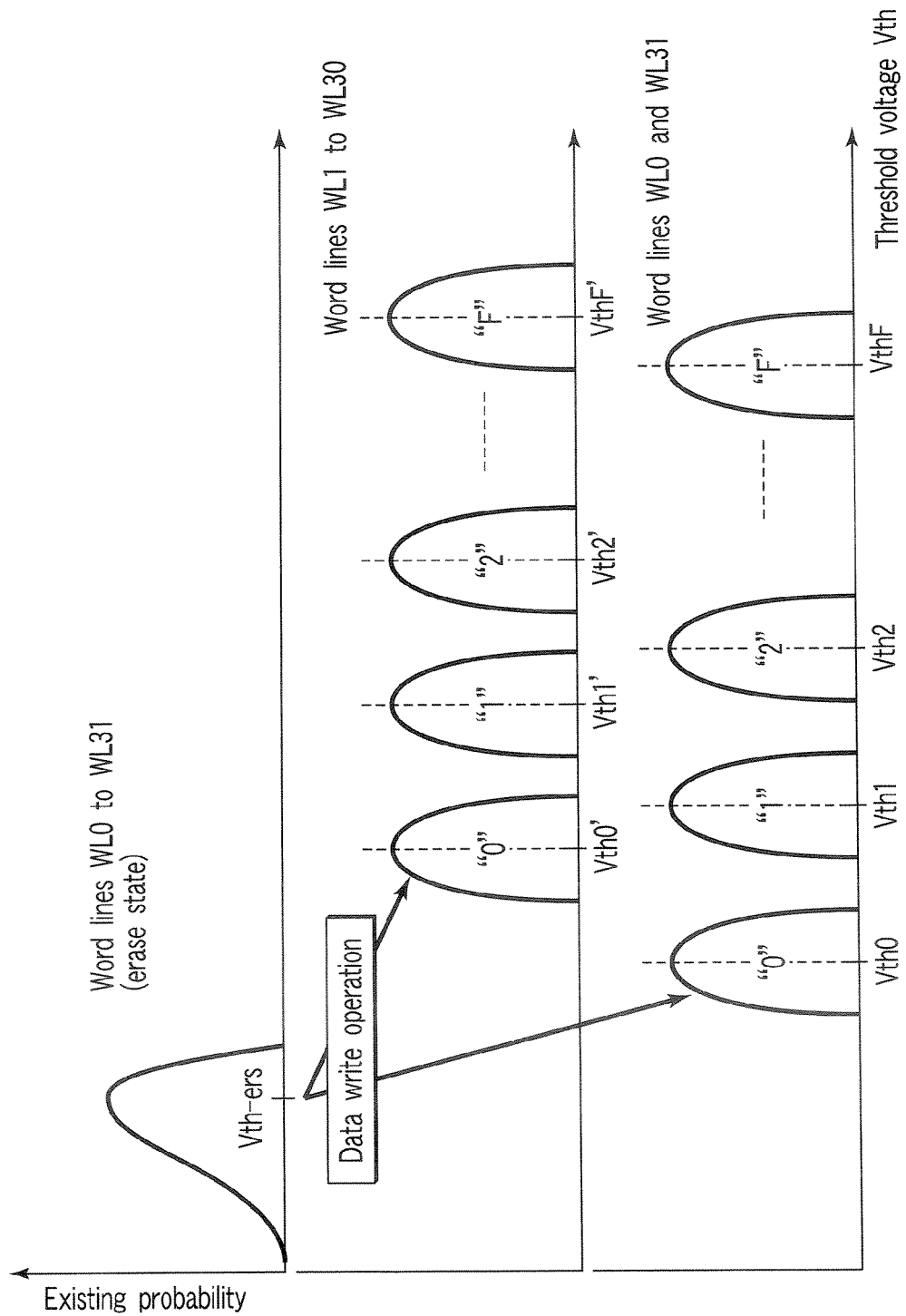
F I G. 27

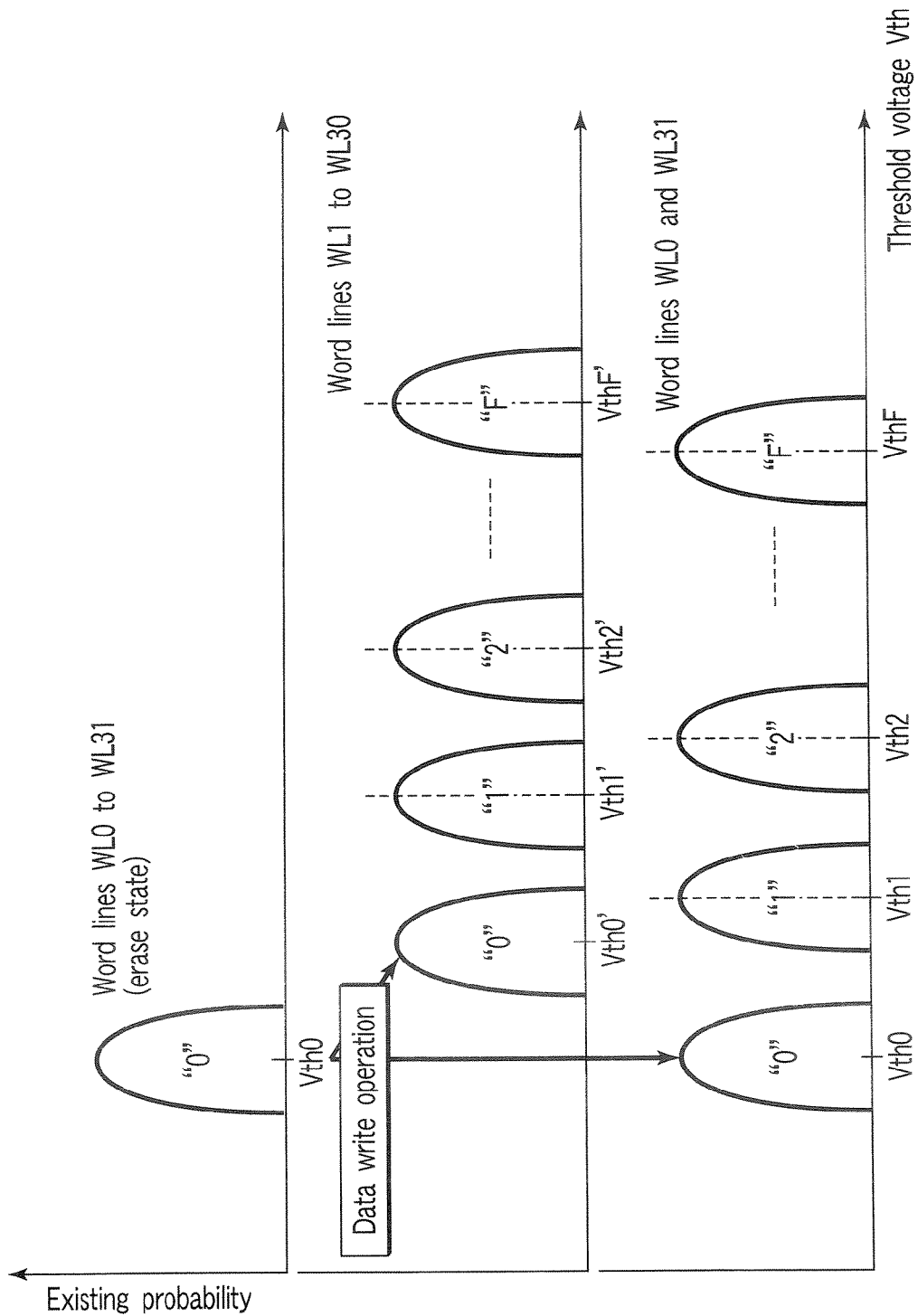
F I G. 28

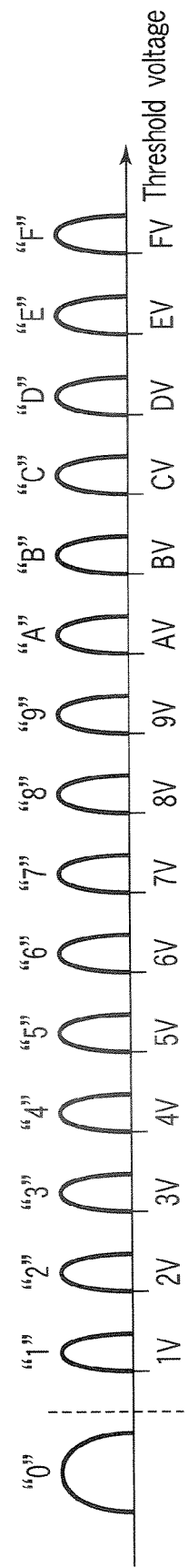
F I G. 33

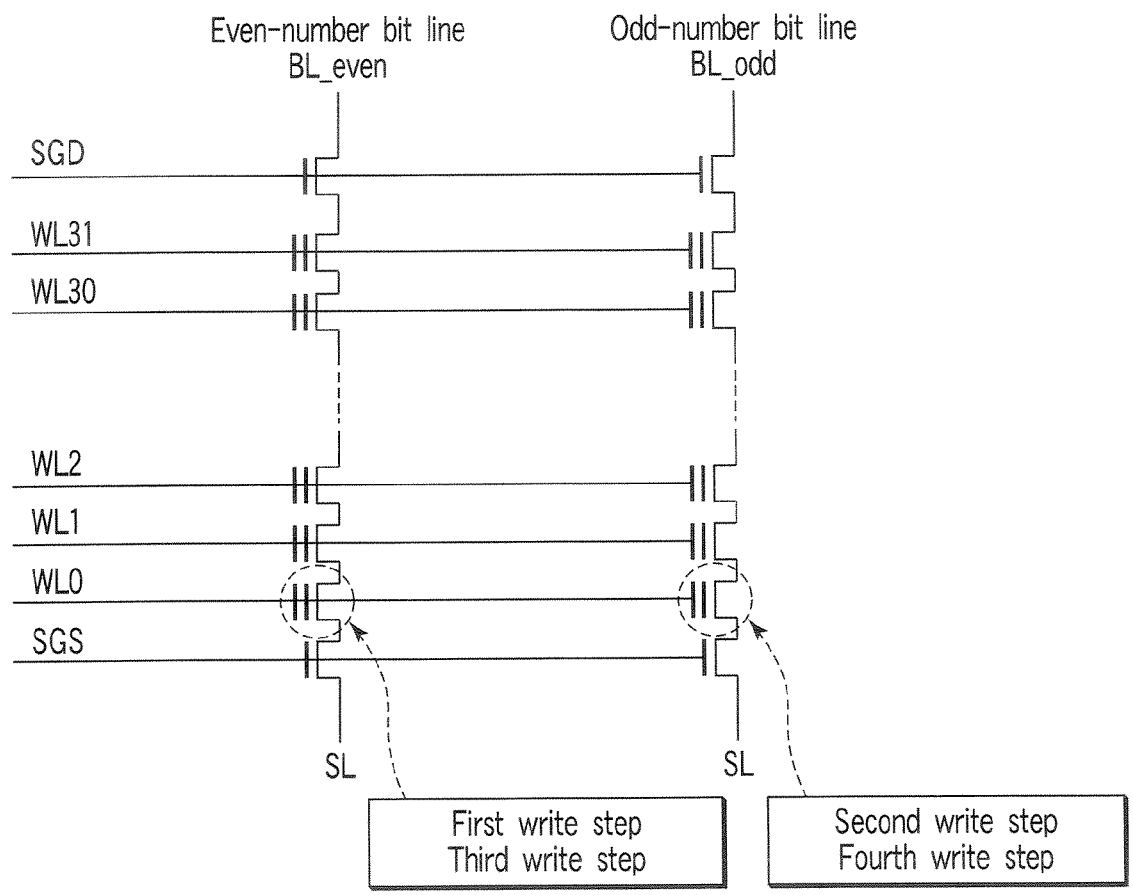
F I G. 37

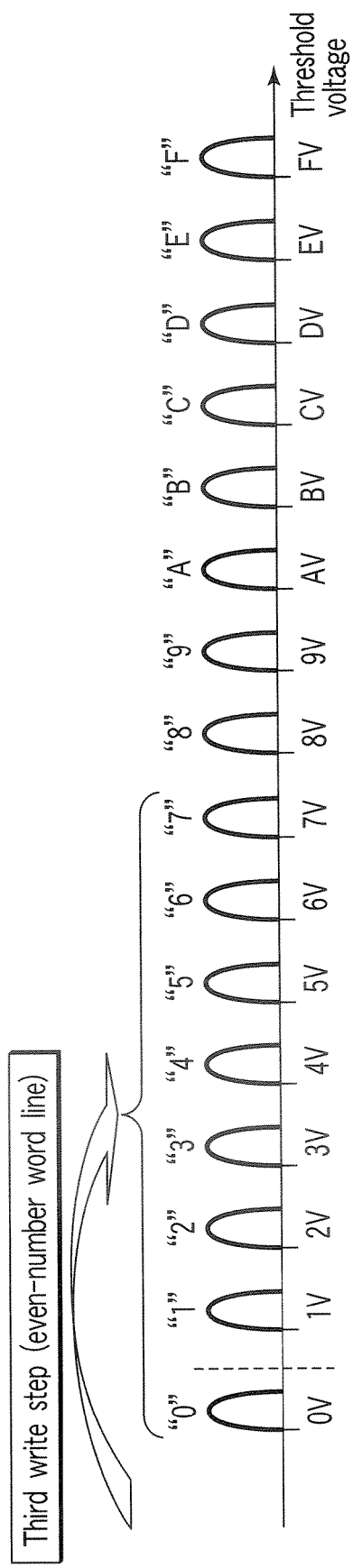
F I G. 40

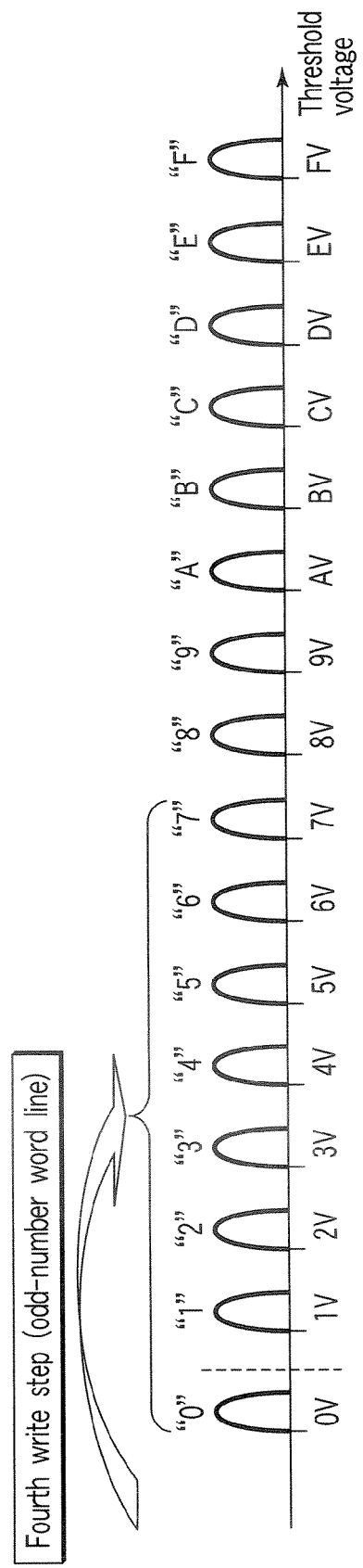
F I G. 41

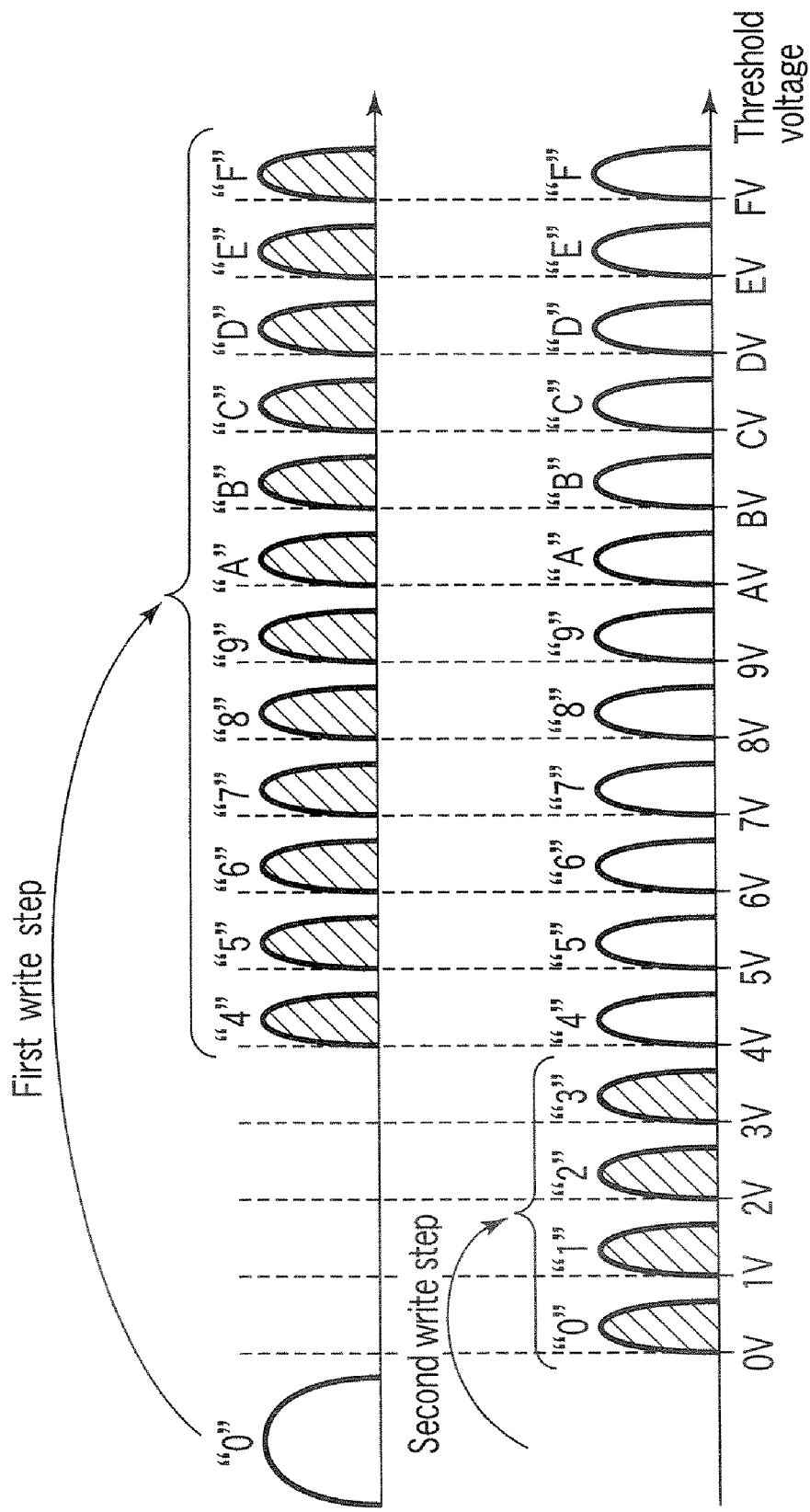
F I G. 42

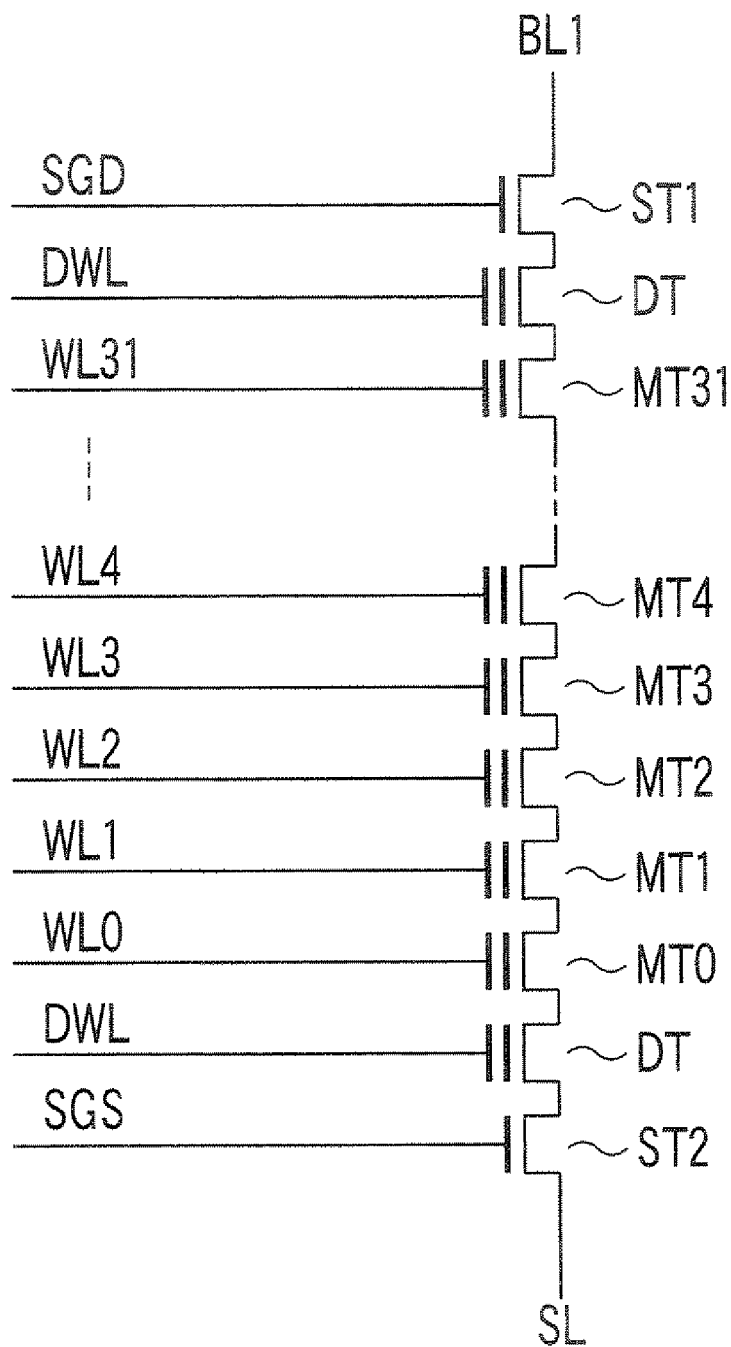
F I G. 45

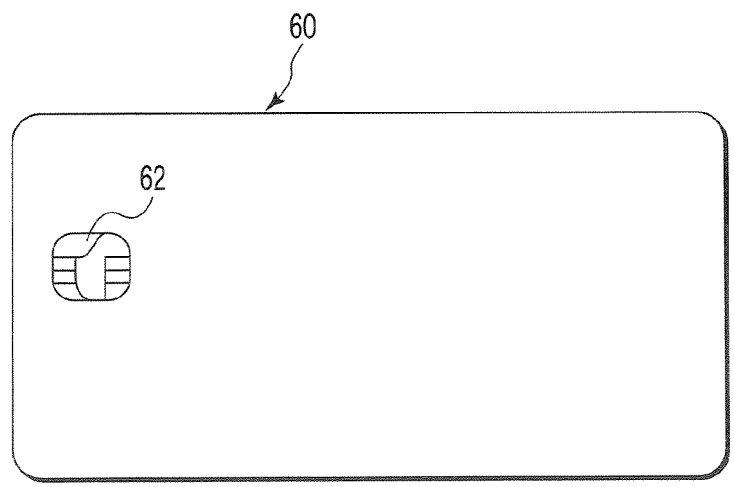
F I G. 47
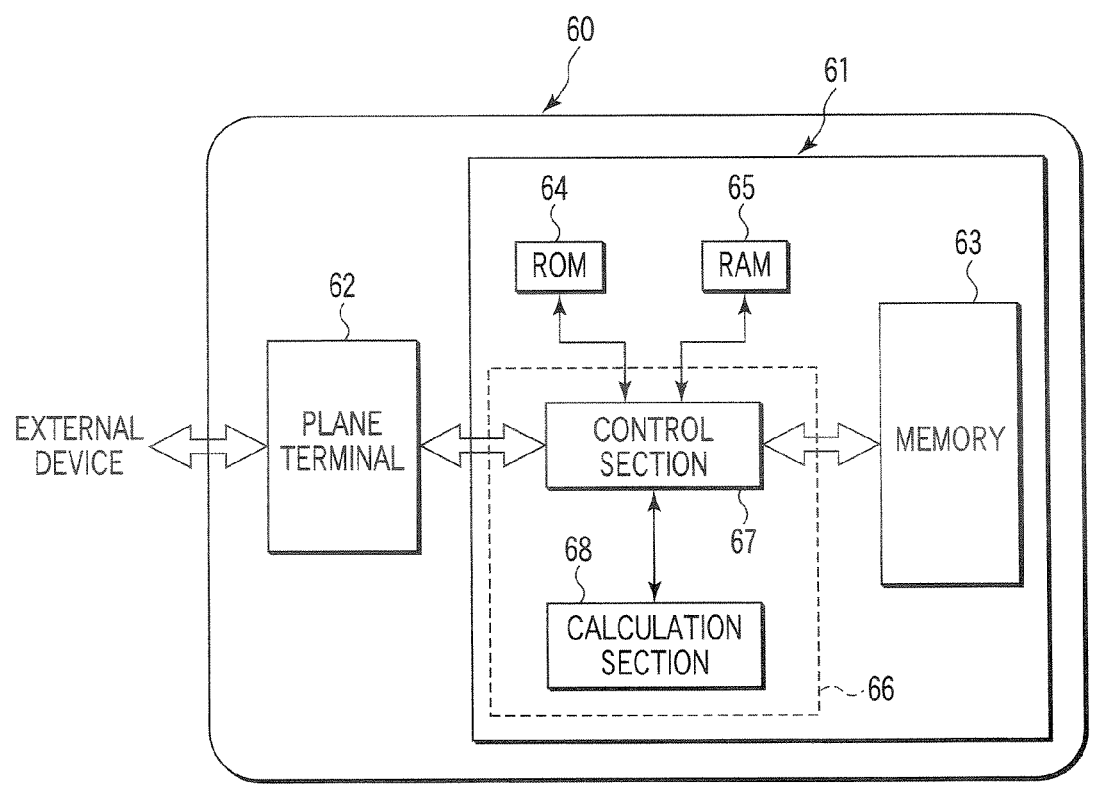
F I G. 48

SEMICONDUCTOR STORAGE DEVICE PROVIDED WITH MEMORY CELL HAVING CHARGE ACCUMULATION LAYER AND CONTROL GATE

CROSS-REFERENCE TO RELATED APPLICATIONS

This application is based upon and claims the benefit of priority from prior Japanese Patent Application No. 2006-179836, filed Jun. 29, 2006, the entire contents of which are incorporated herein by reference.

BACKGROUND OF THE INVENTION

1. Field of the Invention

The present invention relates to a semiconductor storage device. For example, the invention relates to a multi-level NAND-type flash memory having a charge accumulation layer and a control gate.

2. Description of the Related Art

Conventionally, a NAND-type flash memory is well known as a nonvolatile semiconductor memory. A self-boost type memory is widely used in the NAND-type flash memory. In the self-boost type memory, a channel potential is raised by coupling with a gate in a write-inhibit cell, and thereby electrons are prevented from being injected into a floating gate.

In the self-boost type memory, it gas been found that boost efficiency is decreased in the use of a memory cell in which data is written to raise a threshold. Therefore, for example, Jpn. Pat. Appln. KOKAI Publication No. 10-283788 proposes a technique in which the boost efficiency is improved using only an erasing cell by cutting off a channel from a selected memory cell to a memory cell on a source line side.

However, in the conventional technique, the channel cannot be cut off by a threshold voltage of the memory cell, and the boost efficiency is decreased, which results in a problem of wrongly writing the data in the write-protect cell.

During a write operation of the memory cell adjacent to a selection transistor on a source side, sometimes electrons are generated by GIDL (Gate Induced Drain Leakage) in an impurity diffusion layer shared by the memory cell and the selection transistor. The generated electrons act as hot electrons, and are accumulated in a floating gate of the memory cell, which results in a problem of generating the wrong write.

BRIEF SUMMARY OF THE INVENTION

A semiconductor memory device according to an aspect of the present invention includes:

memory cell transistors each of which has a stacked gate including a charge accumulation layer and a control gate, and is configured to retain at least two levels of "0" data and "1" data according to a threshold voltage, the threshold voltage corresponding to the "0" data being the lowest threshold voltage in the levels retained by each of the memory cell transistors;

a memory cell group in which current paths of the memory cell transistors are connected in series;

a first selection transistor whose current path is connected in series to one of the memory cell transistors located closest to a source side in the memory cell group;

word lines each of which is connected to the control gate of one of the memory cell transistors, upper limit values of threshold voltages of the memory cell transistors retaining the "0" data being different from one another in each word line; and a first selection gate line which is connected to a gate of the first selection transistor.

BRIEF DESCRIPTION OF THE SEVERAL VIEWS OF THE DRAWING

FIG. 3 is a sectional view showing the memory cell array included in the flash memory according to the first embodiment of the invention;

FIG. 11 is a circuit diagram showing a NAND cell included in the flash memory according to the second embodiment of the invention, and showing a state in a first soft program;

FIG. 12 is a circuit diagram showing the NAND cell included in the flash memory according to the second embodiment of the invention, and showing a state in first verification;

FIG. 25 is a graph showing the threshold distribution of a memory cell included in the flash memory according to the sixth embodiment of the invention, and showing a change in threshold during erasing;

FIG. 26 is a flowchart showing a data write operation in a flash memory according to a seventh embodiment of the invention;

FIG. 27 is a graph showing the threshold distribution of a memory cell included in the flash memory according to the seventh embodiment of the invention, and showing a change in threshold during data write;

FIG. 28 is a graph showing the threshold distribution of a memory cell included in a flash memory according to a modification of the seventh embodiment of the invention, and showing a change in threshold during the data write;

FIG. 33 is a graph showing the threshold distribution of a memory cell included in a flash memory according to a tenth embodiment of the invention;

FIG. 37 is a circuit diagram showing a NAND cell included in a flash memory according to a modification of the tenth embodiment of the invention;

FIGS. 38 to 41 are graphs showing the threshold distributions of the memory cells included in the flash memory according to the modification of the tenth embodiment of the invention, and showing states of first to fourth write steps, respectively;

FIG. 42 is a graph showing the threshold distribution of a memory cell included in a flash memory according to an eleventh embodiment of the invention, and showing states of first and second write steps;

FIG. 45 is a circuit diagram showing the NAND cell included in the flash memory according to a modification of the first to eleventh embodiments of the invention;

FIG. 47 is an external view showing an IC card provided with the flash memory according to the first to eleventh embodiments of the invention; and FIG. 48 is a block diagram showing the IC card provided with the flash memory according to the first to eleventh embodiments of the invention.

DETAILED DESCRIPTION OF THE INVENTION

First Embodiment

Figure 1:
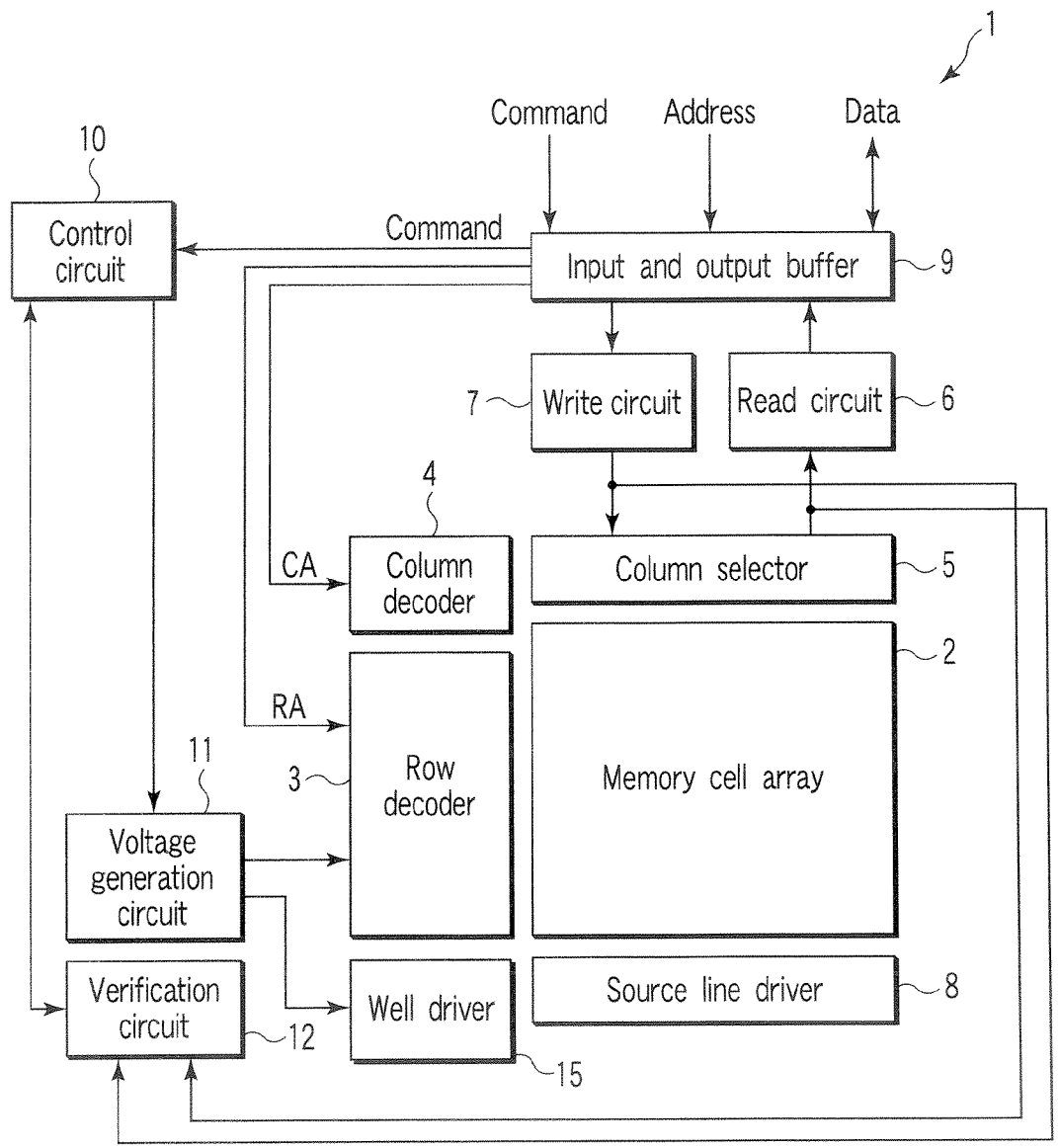
FIG. 1 is a block diagram showing a flash memory according to a first embodiment of the invention.

A semiconductor storage device according to a first embodiment of the invention will be described with reference to FIG. 1. FIG. 1 is a block diagram showing a NAND-type flash memory according to the first embodiment. As shown in FIG. 1, a flash memory 1 includes a memory cell array 2, a row decoder 3, a column decoder 4, a column selector 5, a read circuit 6, a write circuit 7, a source line driver 8, an input and output buffer 9, a control circuit 10, a voltage generation circuit 11, a verification circuit 12, a well driver 15.

Figure 2:
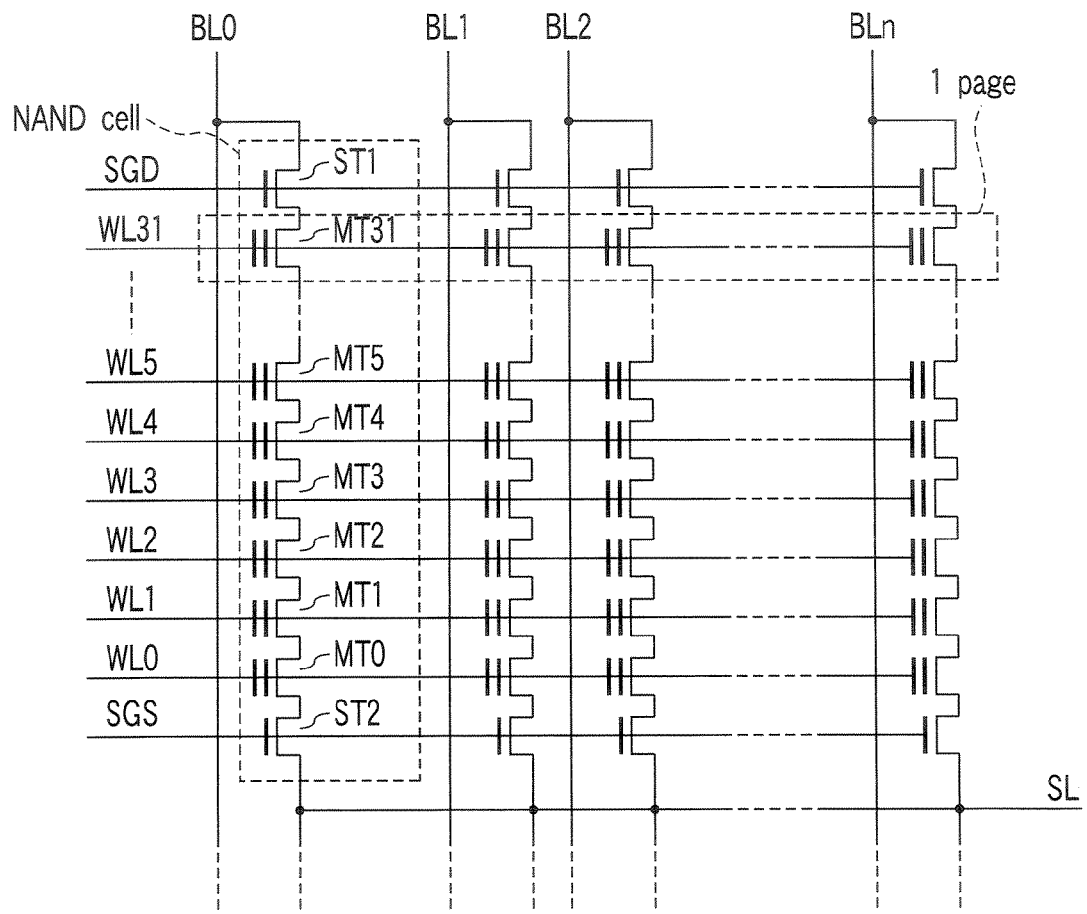
FIG. 2 is a circuit diagram showing a memory cell array included in the flash memory according to the first embodiment of the invention.

The memory cell array 2 includes plural NAND cells arranged in a matrix. A configuration of the memory cell array 2 will be described with reference to FIG. 2. FIG. 2 is a circuit diagram showing a partial region of the memory cell array 2.

As shown in FIG. 2, the memory cell array 2 includes the plural NAND cells. Only one-row NAND cell is shown in FIG. 2. For the purpose of simple explanation, the case in which the NAND cell has one row will be described by way of example. Each NAND cell includes 32 memory cell transistors MT0 to MT31 and selection transistors ST1 and ST2. For the purpose of simple explanation, sometimes the memory cell transistors MT0 to MT31 are simply referred to as memory cell transistor MT. The memory cell transistor MT has a stacked gate structure including a charge accumulation layer (for example, a floating gate in the embodiment) and a control gate. The floating gate is formed on a semiconductor substrate with a gate insulating film interposed therebetween. The control gate is formed on the floating gate with an inter-gate insulating film interposed therebetween. The number of memory cell transistors MT is not limited to 32. For example, 8 or 16 memory cell transistors MT may be used. A source and a drain are shared by the memory cell transistors MT adjacent to each other. Current paths of the sources and drains are arranged to be connected in series between the selection transistors ST1 and ST2. A drain region on one end side of the memory cell transistors MT connected in series is connected to a source region of the selection transistor ST1, and a source region on the other end side is connected to a drain region of the selection transistor ST2.

The control gates of the memory cell transistors MT located in the same row are commonly connected to one of word lines WL0 to WL31, and the gates of the selection transistors ST1 and ST2 of the memory cells located in the same row are commonly connected to selection gate lines SGD and SGS respectively. The drains of the selection transistors ST1 in the same row of the memory cell array are commonly connected to one of bit lines BL0 to BLn (n is a natural number). The sources of the selection transistors ST2 are commonly connected to a source line SL. Both the selection transistors ST1 and ST2 are not always required, but either the selection transistor ST1 or ST2 may be provided as long as the NAND cell can be selected.

A sectional configuration of the NAND cell having the above configuration will be described below with reference to FIG. 3. FIG. 3 is a sectional view along a bit line direction of the NAND cell. Referring to FIG. 3, an n-type well region 21 is formed in a surface region of a p-type semiconductor substrate 20, and a p-type well region 22 is formed in a surface region of the n-type well region 21. A gate insulating film 23 is formed on the p-type well region 22, and gate electrodes of the memory cell transistor MT and selection transistors ST1 and ST2 are formed on the gate insulating film 23. Each of the gate electrodes of the memory cell transistor MT and selection transistors ST1 and ST2 includes a polycrystalline silicon layer 24, an inter-gate insulating film 25, and a polycrystalline silicon layer 26. The polycrystalline silicon layer 24 is formed on the gate insulating film 23, the inter-gate insulating film 25 is formed on the polycrystalline silicon layer 24, and the polycrystalline silicon layer 26 is formed on the inter-gate insulating film 25. For example, the inter-gate insulating film 25 is formed by a silicon oxide film or an ON film, an NO film, or an ONO film which is the laminated structure of the silicon oxide film and a silicon nitride film.

In the memory cell transistor MT, the polycrystalline silicon layer 24 functions as the floating gate (FG). On the other hand, the polycrystalline silicon layers 26 adjacent to each other in a direction orthogonal to the bit line are commonly connected, and function as the control gate (word line WL). In the selection transistors ST1 and ST2, the polycrystalline silicon layers 24 and 26 adjacent to each other in the word-line direction are commonly connected. The polycrystalline silicon layers 24 and 26 function as the selection gate lines SGS and SGD. Alternatively, only the polycrystalline silicon layer 24 may function as the selection gate line. In this case, potentials of the polycrystalline silicon layers 26 of the selection transistors ST1 and ST2 are set to a constant or floating state. An n-type impurity diffusion layer 27 is formed in a surface of the p-type well region 22 which is located between the gate electrodes. The impurity diffusion layer 27 is shared by the adjacent transistors, and the impurity diffusion layer 27 acts as the source (S) or the drain (D).

An interlayer dielectric 28 is formed on the p-type well region 22 such that the memory cell transistor MT and the selection transistors ST1 and ST2 are covered with the interlayer dielectric 28. A contact plug CP1 is formed in the interlayer dielectric 28 so as to reach the impurity diffusion layer (source) 27 of the selection transistor ST2 on the source side. A metal interconnection layer 29 is formed on the interlayer dielectric 28 so as to be connected to the contact plug CP1. The metal interconnection layer 29 functions as the source line SL. A contact plug CP2 is formed in the interlayer dielectric 28 so as to reach the impurity diffusion layer (drain) 27 of the selection transistor ST1 on the drain side. A metal interconnection layer 30 is formed on the interlayer dielectric 28 so as to be connected to the contact plug CP2.

An interlayer dielectric 31 is formed on the interlayer dielectric 28 such that the metal interconnection layers 29 and 30 are covered with the interlayer dielectric 31. A contact plug CP3 is formed in the interlayer dielectric 31 so as to reach the metal interconnection layer 30. A metal interconnection layer 32 commonly connected to the plural contact plugs CP3 is formed on the interlayer dielectric 31. The metal interconnection layer 32 functions as the bit line BL. Hereinafter, sometimes the memory cell transistor MT is simply referred to as memory cell.

Returning to FIG. 1, explanation of the configuration of the flash memory 1 will be continued. The row decoder 3 selects one of the word lines WL0 to WL31 and the selection gate lines SGD and SGS based on a row address signal RA, and supplies a voltage to the selected word line and the selection gate lines SGD and SGS.

The column decoder 4 selects a column direction of the memory cell array 2 based on a column address signal CA.

The column selector 5 selects the bit lines BL0 to BLn based on the selection operation of the column decoder 4, and connects the selected bit lines to the read circuit 6 or write circuit 7.

The read circuit 6 senses and amplifies data read on the bit line during a read operation.

The write circuit 7 supplies write data to the bit line during a write operation.

The source line driver 8 gives the voltage to the source line SL.

The input and output buffer 9 controls signal transmission and reception to and from the outside. That is, the input and output buffer 9 outputs the read data amplified by the read circuit 6 to the outside, and gives the write data received from the outside to the write circuit. The input and output buffer 9 transfers the column address signal CA received from the outside to the column decoder 4, transfers the row address signal RA to the row decoder 4, and transfers various commands to the control circuit 10.

The voltage generation circuit 11 generates the positive voltage based on the command from the control circuit 10, and supplies the voltage to the row decoder 3 and a well driver 15.

The verification circuit 12 receives the write data and read data to perform a verification operation.

The well driver 15 supplies the voltage to the semiconductor substrate (p-type well region 22) on which the memory cell is formed.

The control circuit 10 controls the operation of the circuit block based on various commands.

Figure 4:
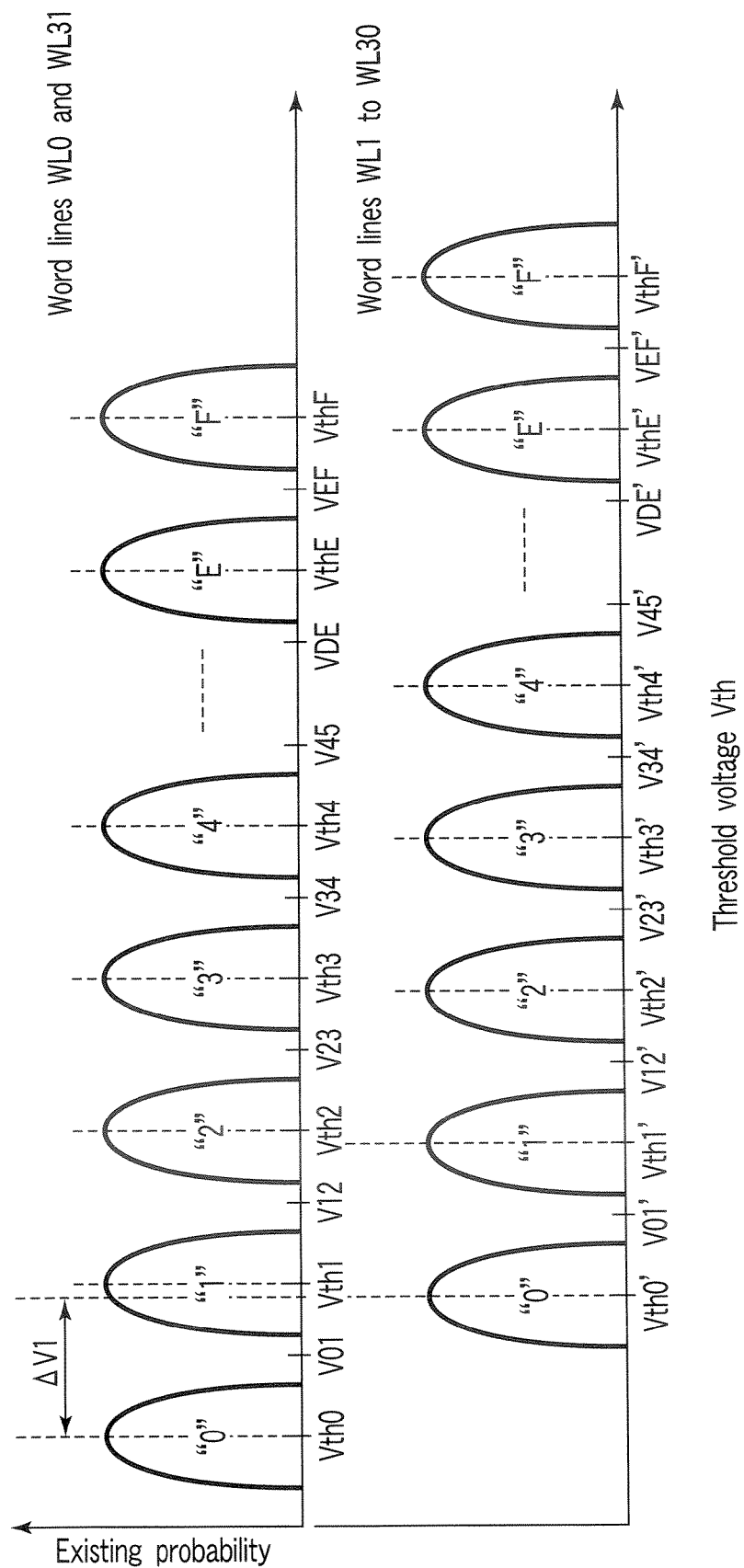
FIG. 4 is a graph showing a threshold distribution of the memory cell included in the flash memory according to the first embodiment of the invention.

A threshold distribution of the memory cell transistors MT included in the NAND-type flash memory having the above configuration will be described below with reference to FIG. 4. FIG. 4 shows a graph in which a threshold voltage Vth is set to a horizontal axis while an existing probability of the memory cell transistor MT is set to a vertical axis.

As shown in FIG. 4, each memory cell transistor MT can retain 16 levels (16-kinds) of data (four-bit data). That is, the memory cell transistor MT can retain 16 levels of data of "0" data, "1" data, "2" data, "3" data, . . . , "9" data, "A" data, "B" data, and "F" data in ascending order of the threshold voltage Vth. The threshold voltage of at least the "0" data in the memory cell transistor MT connected to the word lines WL0 and WL31 is set lower than the threshold voltage of the "0" data in the memory cell transistor MT connected to the word lines WL1 to WL30 except for the word lines WL0 and WL31.

The threshold voltage of the memory cell transistors MT0 and MT31 will be described in detail. In the memory cell transistors MT0 and MT31, a threshold voltage Vth0 of the "0" data is Vth0<V01. A threshold voltage Vth1 of the "1" data is V01<Vth1<V12. A threshold voltage Vth2 of the "2" data is V12<Vth2<V23. A threshold voltage Vth3 of the "3" data is V23<Vth3<V34. A threshold voltage Vth4 of the "4" data is V34<Vth4<V45. A threshold voltage Vth5 of the "5" data is V45<Vth5<V56. A threshold voltage Vth6 of the "6" data is V56<Vth6<V67. A threshold voltage Vth7 of the "7" data is V67<Vth7<V78. A threshold voltage Vth8 of the "8" data is V78<Vth8<V89. A threshold voltage Vth9 of the "9" data is V89<Vth9<V9A. A threshold voltage VthA of the "A" data is V9A<VthA<VAB. A threshold voltage VthB of the "B" data is VAB<VthB<VBC. A threshold voltage VthC of the "C" data is VBC<VthC<VCD. A threshold voltage VthD of the "D" data is VCD<VthD<VDE. A threshold voltage VthE of the "E" data is VDE<VthE<VEF. A threshold voltage VthF of the "F" data is VEF<VthF.

Then, the threshold voltage of the memory cell transistors MT1 to MT30 will be described in detail. In the memory cell transistors MT1 to MT30, a threshold voltage Vth0' of the "0" data is Vth0'<V01'. A threshold voltage Vth1' of the "1" data is V01'<Vth1'<V12'. A threshold voltage Vth2' of the "2" data is V12'<Vth2'<V23'. A threshold voltage Vth3' of the "3" data is V23'<Vth3'<V34'. A threshold voltage Vth4' of the "4" data is V34'<Vth4'<V45'. A threshold voltage Vth5' of the "5" data is V45'<Vth5'<V56'. A threshold voltage Vth6' of the "6" data is V56'<Vth6'<V67'. A threshold voltage Vth7' of the "7" data is V67'<Vth7'<V78'. A threshold voltage Vth8' of the "8" data is V78'<Vth8'<V89'. A threshold voltage Vth9' of the "9" data is V89'<Vth9'<V9A'. A threshold voltage VthA' of the "A" data is V9A'<VthA'<VAB'. A threshold voltage VthB' of the "B" data is VAB'<VthB'<VBC'. A threshold voltage VthC' of the "C" data is VBC'<VthC'<VCD'. A threshold voltage VthD' of the "D" data is VCD'<VthD'<VDE'. A threshold voltage VthE' of the "E" data is VDE'<VthE'<VEF'. A threshold voltage VthF' of the "F" data is VEF'<VthF'.

There is a relationship of Vth0<Vth0' between Vth0 and Vth0', and Vth0'=(Vth0+ΔV1). In other words, a lower limit value of Vth0' is higher than an upper limit value of Vth0. That is, a relationship of V01<Vth01<V01' holds. The threshold voltage Vth0' is a value at which the memory cell transistors MT1 to MT30 are turned off when the potentials of the source and drain are sufficiently boosted in applying 0 V to the gate. For example, the threshold voltage Vth0 has a negative value.

The NAND-type flash memory having the above configuration obtains the following effects (1) and (2).

(1) Data write reliability can be improved (part 1).

In above configuration, the generation of the false data write can be prevented in one of the memory cell transistors MT1 to MT30 which is connected to the selected word line and in which the data should not be written. The effect (1) will be described below.

The data write with the self-boost type is substantially performed as follows. The data is sequentially written from the memory cell transistor MT on the side of the source line SL in the NAND cell. When the word line WLm (m=3 to 30) is selected, a write voltage Vpgm is applied to the word line WLm, and a voltage Vpass is applied to the word lines WL(m+1) to WL31. The voltage Vpass is a voltage at which the memory cell transistor MT (in the erase state) retaining the "0" data is turned on. An intermediate voltage VGP (about 3 V) is applied to the word line WL(m−1), and 0 V is applied to the word line WL(m−2). Zero V is applied to the bit line BL connected to the memory cell transistor MT in which the data should be written, and VDD is applied to the bit line BL connected to the memory cell transistor MT in which the data should not be written. The selection gate line SGS is set to 0 V, and a voltage which passes 0 V while does not pass VDD is applied to the selection gate line SGD.

Figure 5:
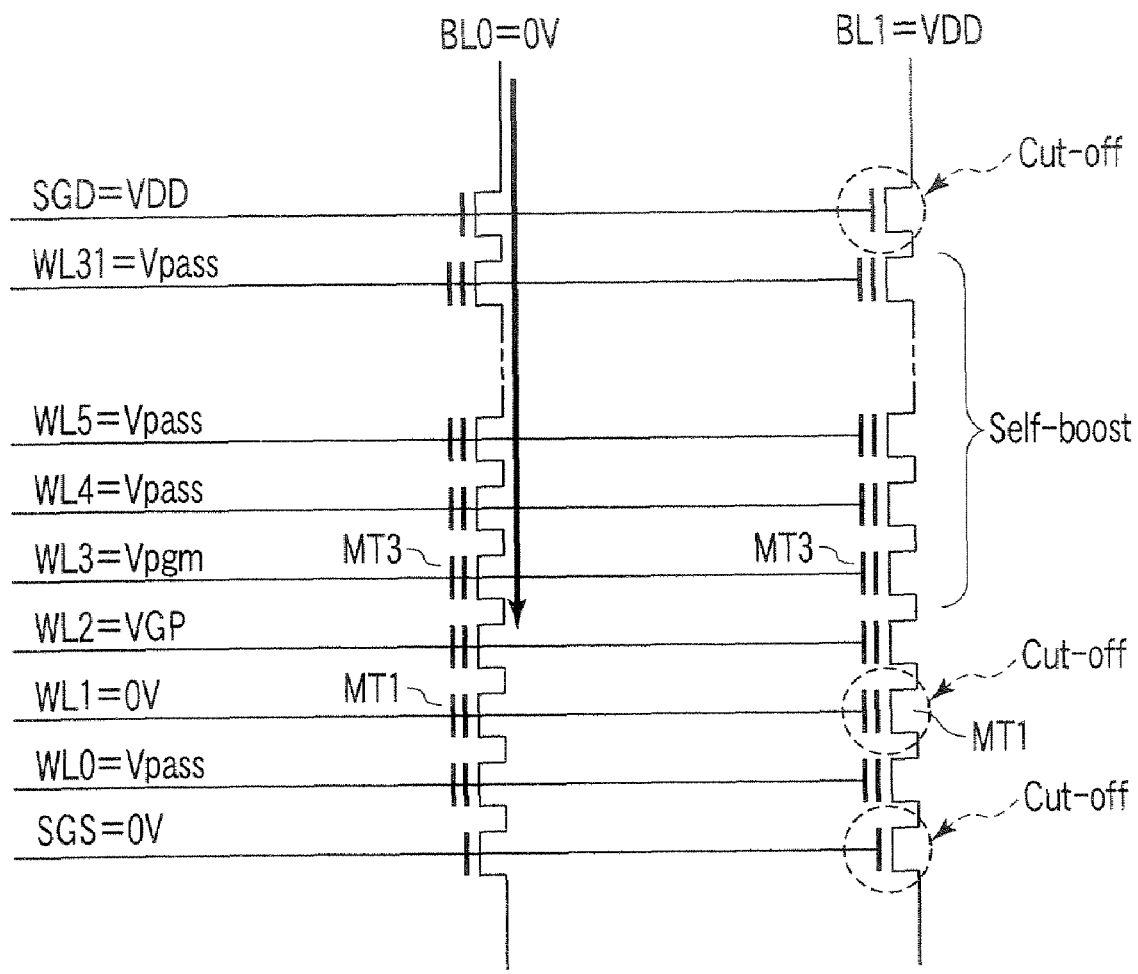
FIGS. 5 and 6 are circuit diagrams showing the memory cell array included in the flash memory according to the first embodiment of the invention, and showing write states.

The specific example is shown in FIG. 5. FIG. 5 is a circuit diagram of the NAND cell. In the case shown in FIG. 5, the data is written in the memory cell transistor MT3 which is connected to both the bit line BL0 and the word line WL3, and the data is not written in the memory cell transistor MT3 which is connected to both the bit line BL1 and the word line WL3.

As shown in FIG. 5, the write voltage Vpgm is applied to the word line WL3, the intermediate voltage VGP is applied to the word line WL2, 0 V is applied to the word line WL1, and the voltage Vpass is applied to the word lines WL4 to WL31.

First, the NAND cell connected to the bit line BL0 will be described. The selection transistor ST2 is cut off. On the other hand, the selection transistor ST1 is turned on because the bit line BL0 has the potential of 0 V. Because the voltage Vpass is applied to the word lines WL4 to WL31, 0 V applied to the bit line BL0 reaches the channel of the memory cell transistor MT3. Thus, electrons are injected into the floating gate of the memory cell transistor MT3 by FN tunneling.

Then, the NAND cell connected to the bit line BL1 will be described. The selection transistor ST2 is cut off. Because the bit line BL1 has the potential of VDD, the selection transistor ST1 is also cut off, which causes the memory cell transistors MT0 to MT31 in the NAND cell to be electrically isolated from both the bit line BL1 and the source line SL. Because 0 V is applied to the word line WL1, the memory cell transistor MT1 is cut off. As a result, the channel potentials of the memory cell transistors MT3 to MT31 are raised by the coupling with the word lines WL3 to WL31, which decreases a potential difference between the channel and the gate in the memory cell transistor MT3. Accordingly, no electrons are injected into the floating gate, and the data is not written.

Thus, in the NAND cell in which the data should not be written, the memory cell transistor MT connected to the word line WL(m−2) is cut off, which causes the self-boost to be performed with only the memory cell transistor MT which is in the erase state.

However, as described in the background art, when the memory cell transistor MT1 retains the "0" data in FIG. 5, namely, when the memory cell transistor MT1 has the threshold voltage of the erase state, there is a risk of not being able to cut off the memory cell transistor MT1 even if 0 V is applied to the word line WL1. Therefore, the self-boost is performed with the memory cell transistor MT in which the data is already written, which worsens the boost efficiency.

On the contrary, in the configuration of the first embodiment, the threshold voltage Vth0' of the "0" data of the memory cell transistors MT1 to MT30 is set higher than the threshold voltage Vth0 of the "0" data of the memory cell transistors MT0 and MT31. Vth0' is set to the value at which the transistor is turned off when the potentials of the source and the drain are adequately boosted at the time of applying 0 V to the gate.

Accordingly, even if the memory cell transistor MT1 retains the "0" data in the case shown in FIG. 5, the memory cell transistor MT1 can be cut off more surely. This allows the self-boost to be performed to improve the boost efficiency only with the memory cell transistor MT which is in the erase state. As a result, the generation of the false data write can be prevented for the non-selected memory cell transistor MT3 to improve the write reliability.

(2) Data write reliability can be improved (part 2).

Figure 6:
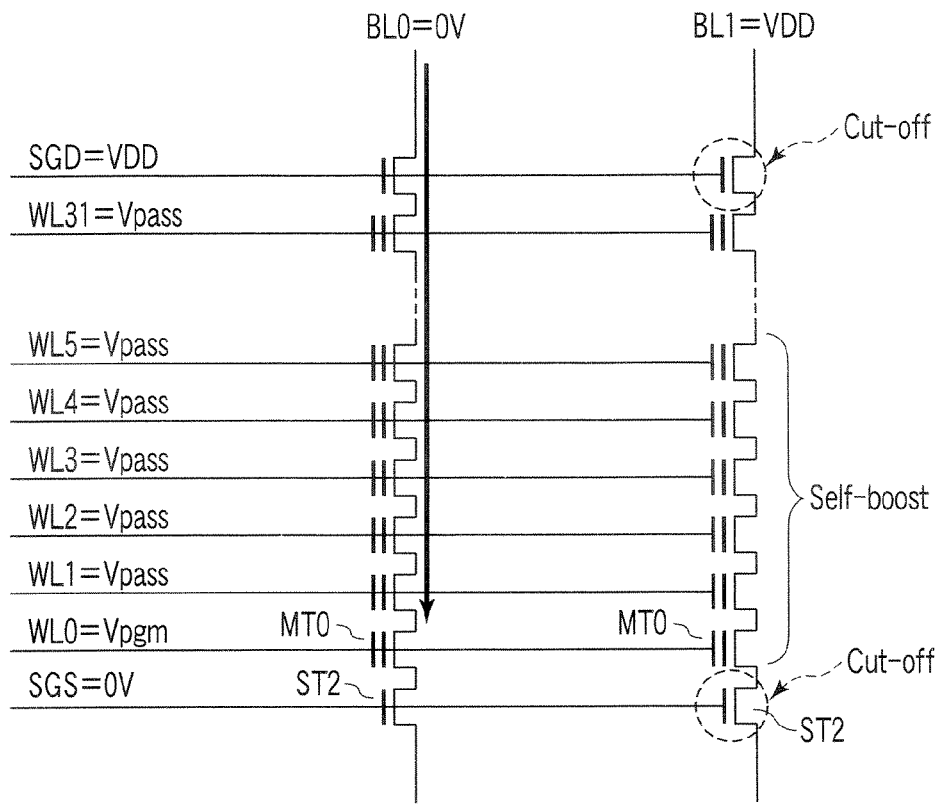

In above configuration, the generation of the false data write can be prevented in one of the memory cell transistors MT0 to MT31 which is connected to the selected word line and in which the data should not be written. The effect (2) will be described below. FIG. 6 is a circuit diagram of the NAND cell. In the case shown in FIG. 6, the data is written in the memory cell transistor MT0 which is connected to both the bit line BL0 and the word line WL0, and the data is not written in the memory cell transistor MT0 which is connected to both the bit line BL1 and the word line WL0.

Figure 7:
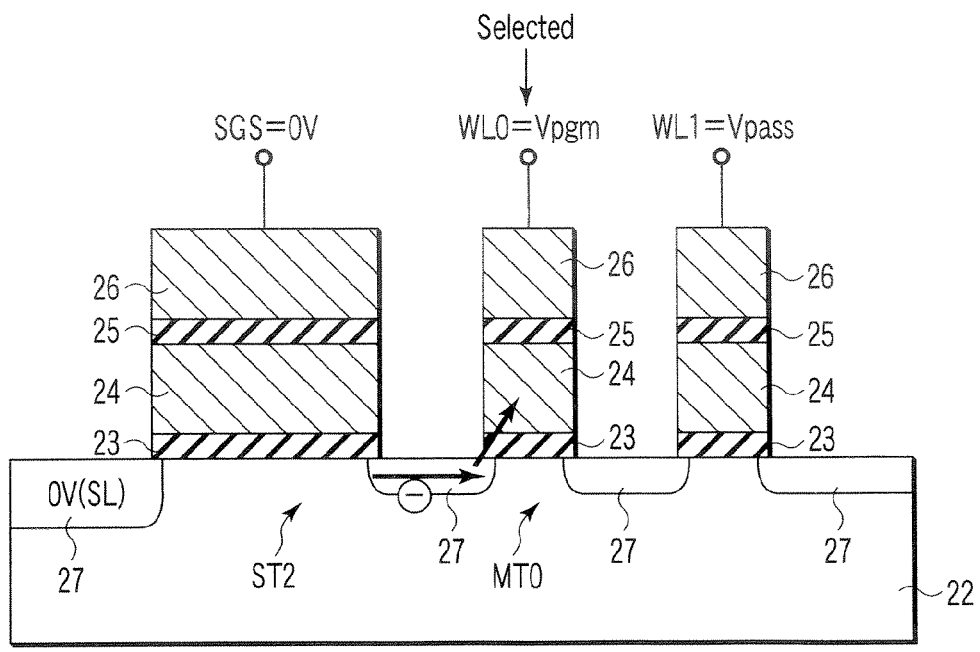
FIG. 7 is a sectional view showing a partial region of the memory cell array included in the flash memory.

As shown in FIG. 6, the write voltage Vpgm is applied to the word line WL0, the voltage Vpass is applied to the word lines WL1 to WL31, and 0 V is applied to the selection gate line SGS. As a result, in the NAND cell connected to the bit line BL1, the channel potential of the memory cell transistor MT0 is raised by the self-boost with the memory cell transistors MT0 to MT31. However, 0 V is applied to the selection gate line SGS adjacent to the word line WL0 to which the high voltage Vpgm is applied, which causes a risk of wrongly writing the data in the memory cell transistor MT0. This point will be described with reference to FIG. 7. FIG. 7 is a sectional view showing a partial region of the NAND cell connected to the bit line BL1, and particularly showing the selection transistor ST2 and the memory cell transistors MT0 and MT1.

As shown in FIG. 7, 0 V is applied to the gates 24 and 26 of the selection transistor ST2. On the other hand, the high voltage boosted by the self-boost with the memory cell transistors MT0 to MT31 is applied to the channel of the memory cell transistor MT0. Accordingly, a high electric field is generated in the impurity diffusion layer 27 located between the selection transistor ST2 and the memory cell transistor MT0, which generates band-to-band tunnel current in the impurity diffusion layer. The generated electrons are injected into the floating gate of the memory cell transistor MT0, which sometimes results in the generation of the false write. The false write is easily generated as the boosted channel potential is increased. That is, the false write is easily generated as the write voltage Vpgm is increased.

On the contrary, in the configuration of the first embodiment, the threshold voltage Vth0 of the "0" data of the memory cell transistors MT0 and MT31 is set lower than the threshold voltage Vth0' of the "0" data of the memory cell transistors MT1 to MT30. That is, the voltage Vpgm used to write the data in the memory cell transistor MT0 can be set lower than the voltage used to write the data in other memory cell transistors MT1 to MT30. As a result, the electric field generated in the impurity diffusion layer 27 located between the selection transistor ST2 and the memory cell transistor MT0 can be decreased. Therefore, the generation of the false write caused by the tunnel current can be prevented in the memory cell transistor MT0 to improve the write reliability.

It is desirable that Vth1' to VthF' be larger than Vth1 to VthF by ΔV1, respectively, as in the case where Vth0' is larger than Vth0 by ΔV1. This is because the generation of the false write or false read can be prevented by maintaining the threshold voltage difference between data.

Although the memory cell transistor MT0 has been described above, the same holds true for the memory cell transistor MT31.

Second Embodiment

Figure 8:
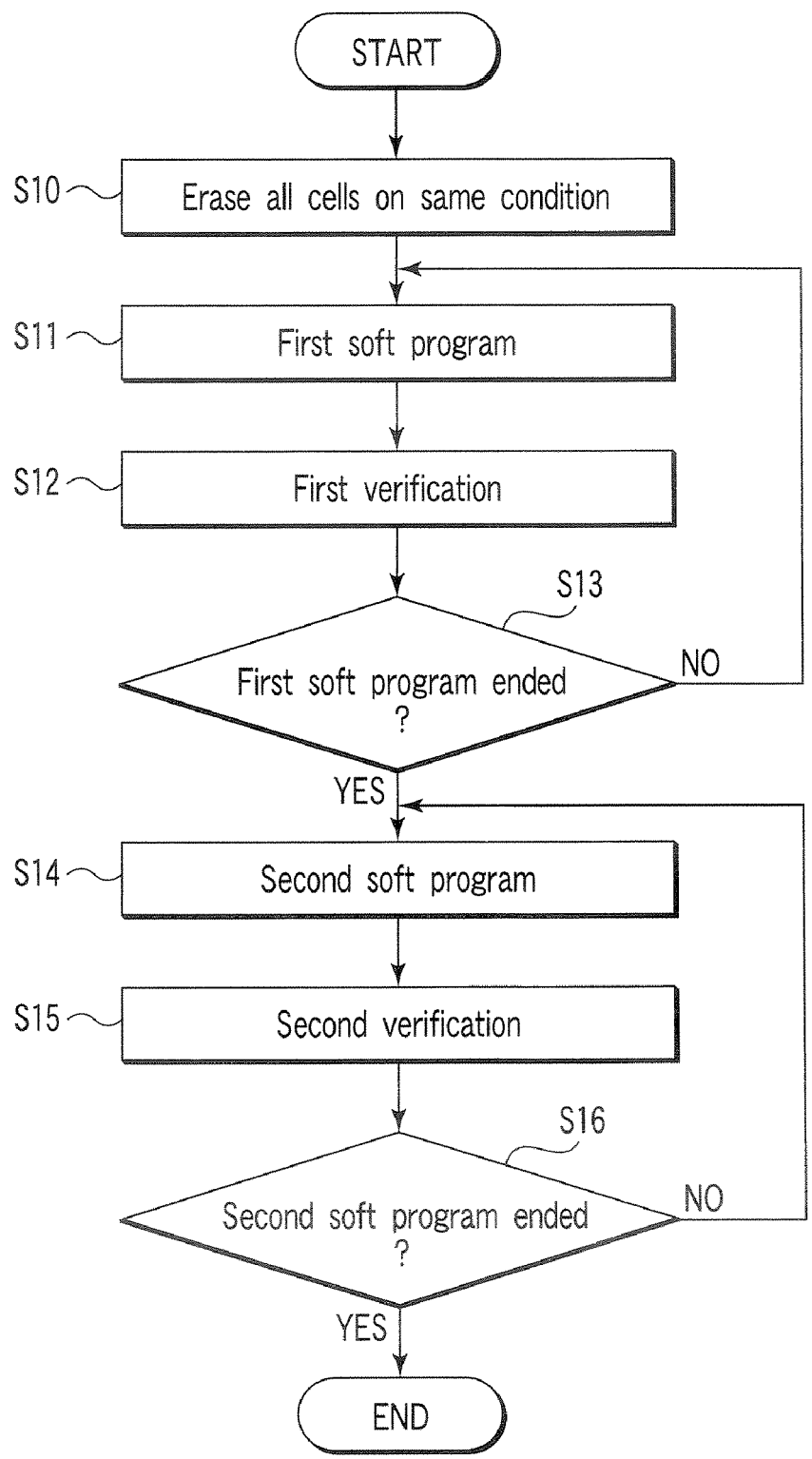
FIG. 8 is a flowchart showing a threshold setting method in a flash memory according to a second embodiment of the invention.

A semiconductor storage device according to a second embodiment of the invention will be described below. The second embodiment relates to a method of realizing the threshold distribution shown in FIG. 4 of the first embodiment. FIG. 8 is a flowchart showing a threshold setting method according to the second embodiment. The setting of the threshold distribution is performed during the data erasing.

Figure 9:
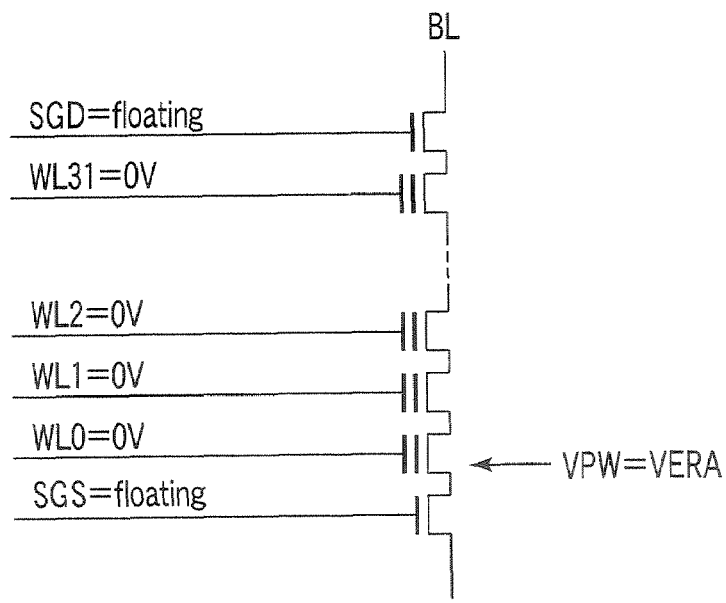
FIG. 9 is a circuit diagram showing a NAND cell included in the flash memory according to the second embodiment of the invention, and showing a state during erasing.
Figure 10:
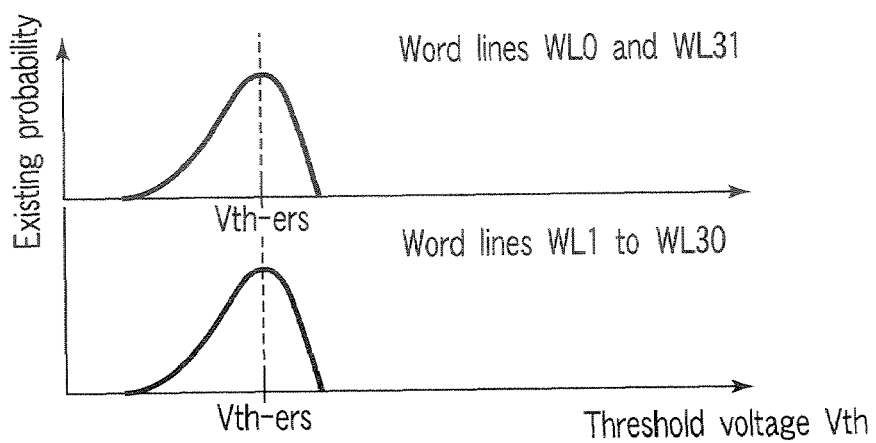
FIG. 10 is a graph showing the threshold distribution of a memory cell included in the flash memory according to the second embodiment of the invention, and showing a change in threshold during the erasing.

All the data of the memory cell transistors MT0 to MT31 are erased on the same condition by the conventional method (Step S10). FIG. 9 shows the state of the NAND cell when Step S10 is performed. FIG. 9 is a circuit diagram showing the NAND cell. As shown in FIG. 9, the row decoder 3 sets the selection gate lines SGD and SGS to the electrical floating state, and applies 0 V to all the word lines WL0 to WL31. The well driver 15 sets a potential VPW of the p-type well region 22 to an erasing voltage VERA (for example, 20 V). As a result, electrons are drawn from the floating gates of all the memory cell transistors MT0 to MT31, and the threshold distribution becomes the state shown in FIG. 10. FIG. 10 is a graph showing the threshold distributions of the memory cell transistors MT0 and MT31 and the memory cell transistors MT1 to MT30. As shown in FIG. 10, all the threshold voltages of the memory cell transistors MT0 to MT31 become an erasing level Vth-ers.

Then, a first soft program is executed (Step S11). As used herein, the first soft program means a process in which data is written in the memory cell transistors MT1 to MT30 and the threshold voltages of the memory cell transistors MT1 to MT30 are set to Vth0'. FIG. 11 is a circuit diagram showing the NAND cell in the first soft program.

As shown in FIG. 11, the row decoder 3 applies a voltage VSGD to a selection gate line SGD to be able to turn on the selection transistor ST1, applies the voltage Vpass to the word lines WL0 and WL31, and applies a voltage Vspgm to the word lines WL1 to WL30. The voltage Vspgm is one which is used to inject the electron into the floating gate. As a result, the potential at the bit line reaches the channels of the memory cell transistors MT1 to MT30 through the channel of the memory cell transistor MT31. As a result, electrons are injected into the floating gates of the memory cell transistors MT1 to MT30 to raise the threshold voltage from the erasing level Vth-ers.

Then, first verification is performed (Step S12). The first verification means a process of determining whether or not the threshold voltages of the memory cell transistors MT1 to MT30 are Vth0', namely, whether or not the threshold voltages are V01<Vth0'<V01' as described in the first embodiment. The first verification is performed by the verification circuit 12. FIG. 12 is a circuit diagram showing the NAND cell in the first verification. As shown in FIG. 12, the row decoder 3 applies the voltage VSG to the selection gate lines SGD and SGS to turn on the selection transistors ST1 and ST2. The row decoder 3 applies a voltage VREAD to the word lines WL0 and WL31 to turn on the memory cell transistors MT0 and MT31. For example, the voltage VDD is applied to the source line SL. The row decoder 3 applies a voltage VSPV (<VREAD) to the word lines WL1 to WL30. The determination whether or not the threshold voltages of the memory cell transistors MT1 to MT30 are Vth0' is made by confirming whether the memory cell transistors MT1 to MT30 are turned on or off on the above conditions. When the threshold voltage does not reach Vth0' (NO in Step S13), the flow returns to Step S11 to execute the first soft program. When the threshold voltage reaches Vth0'(YES in Step S13), a second soft program is executed (Step S14).

Figure 13:
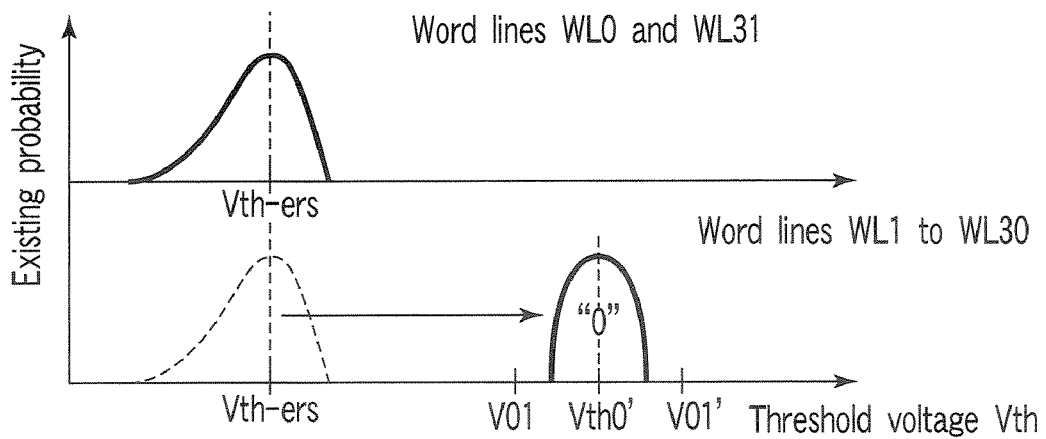
FIG. 13 is a graph showing the threshold distribution of the memory cell included in the flash memory according to the second embodiment of the invention, and showing a change in threshold during the first soft program.

FIG. 13 shows the threshold distribution when Step S13 is completed. As shown in FIG. 13, the memory cell transistors MT1 to MT30 are set to the predetermined threshold level Vth0', whereas the memory cell transistors MT0 and MT31 are kept at the erase level Vth-ers. In the second soft program, the threshold voltages of the memory cell transistors MT0 and MT1 are set to a predetermined range. As used herein, the second soft program means a process in which data is written in the memory cell transistors MT0 and MT31 and the threshold voltages of the memory cell transistors MT0 and MT31 are set to Vth0. The second soft program will be described.

Figure 14:
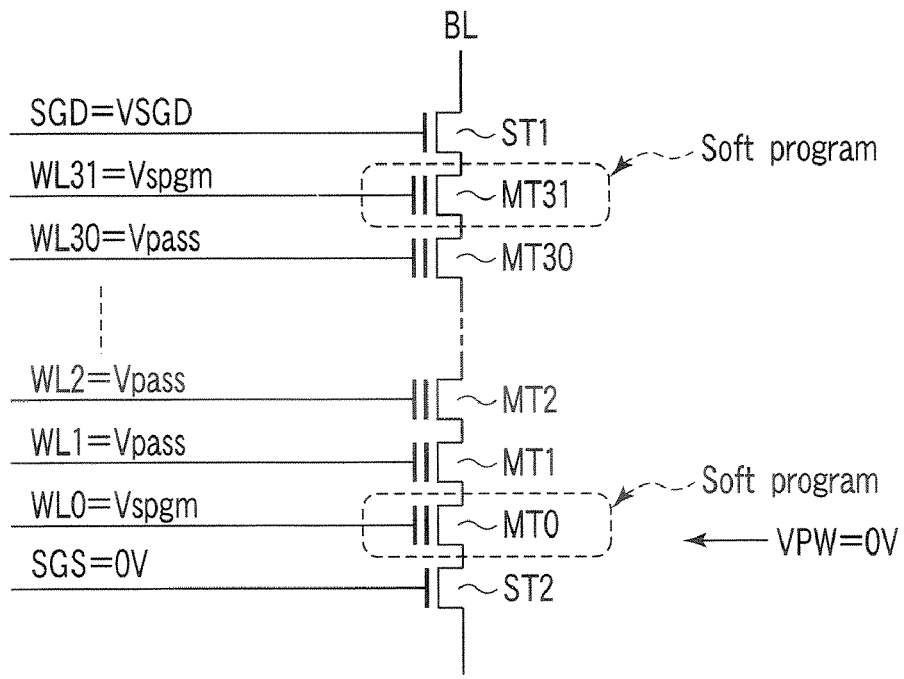
FIG. 14 is a circuit diagram showing the NAND cell included in the flash memory according to the second embodiment of the invention, and showing a state in a second soft program.

FIG. 14 is a circuit diagram showing the NAND cell in the second soft program. As shown in FIG. 14, the voltage VSGD at which the selection transistor ST1 can be turned on is applied to the selection gate line SGD, the voltage Vspgm is applied to the word lines WL0 and WL31, and the voltage Vpass is applied to the word lines WL1 to WL30. As a result, the potential at the bit line reaches the channel of the memory cell transistor MT31, and reaches the channel of the memory cell transistor MT31 through the channels of the memory cell transistors MT1 to MT30. As a result, electrons are injected into the floating gates of the memory cell transistors MT0 and MT31 to raise the threshold voltage from the erase level Vth-ers.

Figure 15:
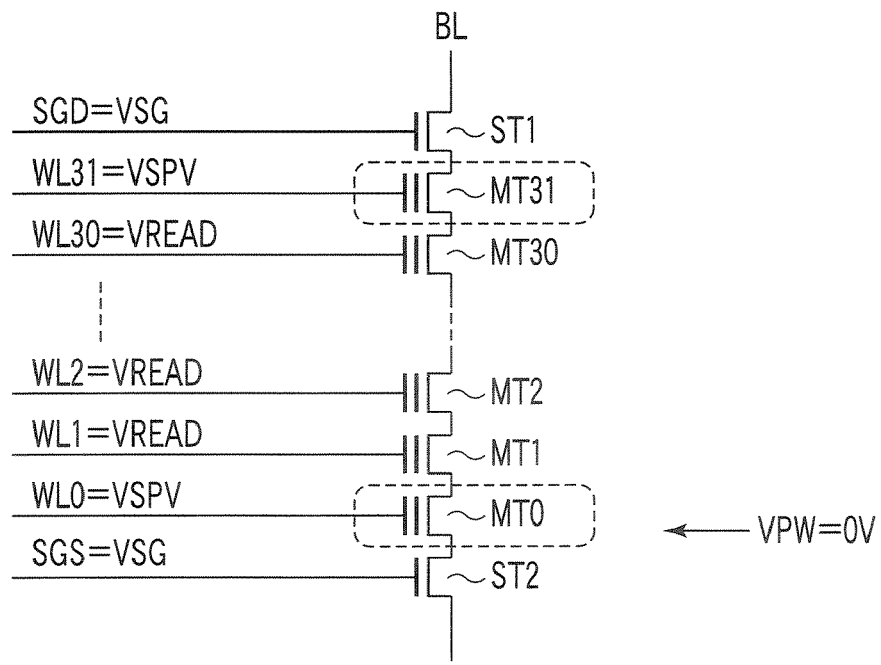
FIG. 15 is a circuit diagram showing the NAND cell included in the flash memory according to the second embodiment of the invention, and showing a state in second verification.
Figure 16:
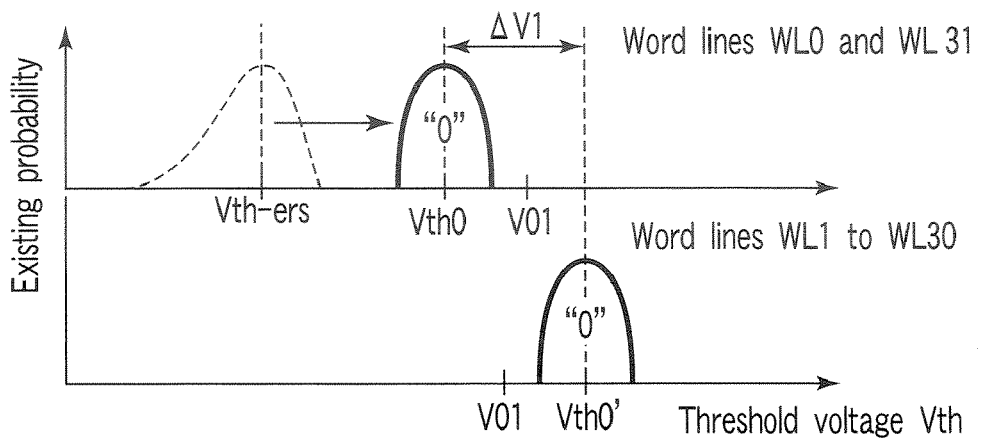
FIG. 16 is a graph showing the threshold distribution of the memory cell included in the flash memory according to the second embodiment of the invention, and showing a change in threshold during the second soft program.

Then, second verification is performed (Step S15). The second verification means a process of determining whether or not the threshold voltages of the memory cell transistors MT0 and MT31 are Vth0, namely, whether or not the threshold voltages are Vth0<V01 as described in the first embodiment. The second verification is also performed by the verification circuit 12. FIG. 15 is a circuit diagram showing the NAND cell in the second verification. As shown in FIG. 15, the row decoder 3 applies the voltage VSG to the selection gate lines SGD and SGS to turn on the selection transistors ST1 and ST2. The row decoder 3 applies the voltage VREAD to the word lines word lines WL1 to WL30 to turn on the memory cell transistors MT1 to MT30. For example, the voltage VDD is applied to the source line SL. The row decoder 3 applies the voltage VSPV (<VREAD) to the word lines WL0 and WL31. The determination whether or not the threshold voltages of the memory cell transistors MT0 and MT31 are Vth0 is made by confirming whether the memory cell transistors MT0 and MT31 are turned on or off on the above conditions. When the threshold voltage does not reach Vth0 (NO in Step S16), the flow returns to Step S14 to execute the second soft program. When the threshold voltage reaches Vth0 (YES in Step S16), the process is ended. FIG. 16 shows the threshold distribution when Step S16 is completed. As shown in FIG. 16, the threshold voltages of the memory cell transistors MT1 to MT30 are set to Vth0', the threshold voltages of the memory cell transistors MT0 and MT31 are set to Vth0, and the difference of $\Delta V1$ is set between the threshold voltages Vth0' and Vth0.

The threshold distribution described in the first embodiment is also obtained by the method of the second embodiment.

Third Embodiment

Figure 17:
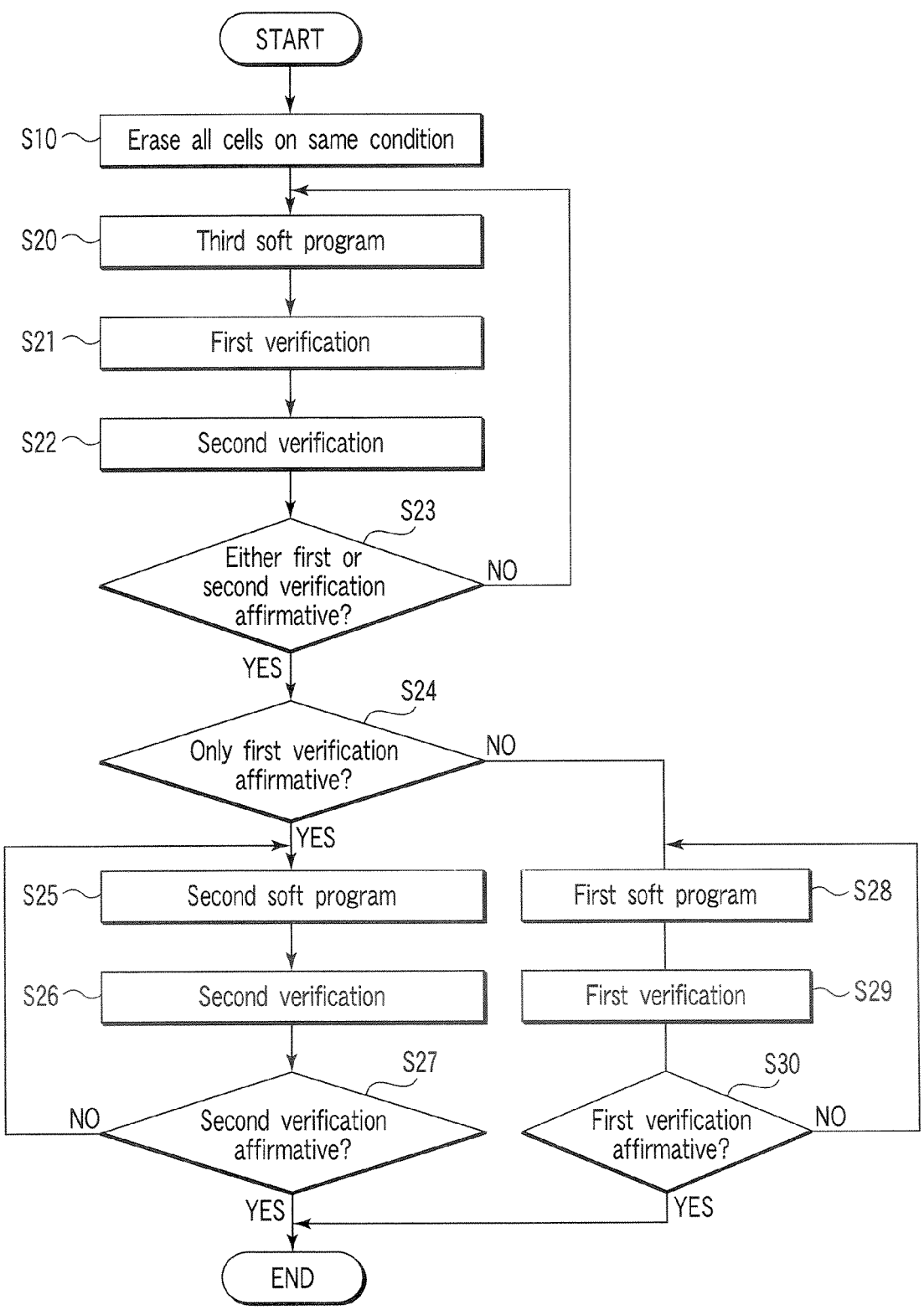
FIG. 17 is a flowchart showing a threshold setting method in a flash memory according to a third embodiment of the invention.

A semiconductor storage device according to a third embodiment of the invention will be described below. The third embodiment relates to a method of realizing the threshold distribution shown in FIG. 4 of the first embodiment, the method being different from that of the second embodiment. FIG. 17 is a flowchart showing the threshold setting method according to the third embodiment. In the third embodiment, the setting of the threshold distribution is also performed during the data erase.

The process of Step S10 described in the second embodiment is performed. That is, the data of all the memory cell transistors MT0 to MT31 are collectively erased on the same condition. As a result, the thresholds of all the memory cell transistors MT0 to MT31 become the erase level Vth-ers.

Figure 18:
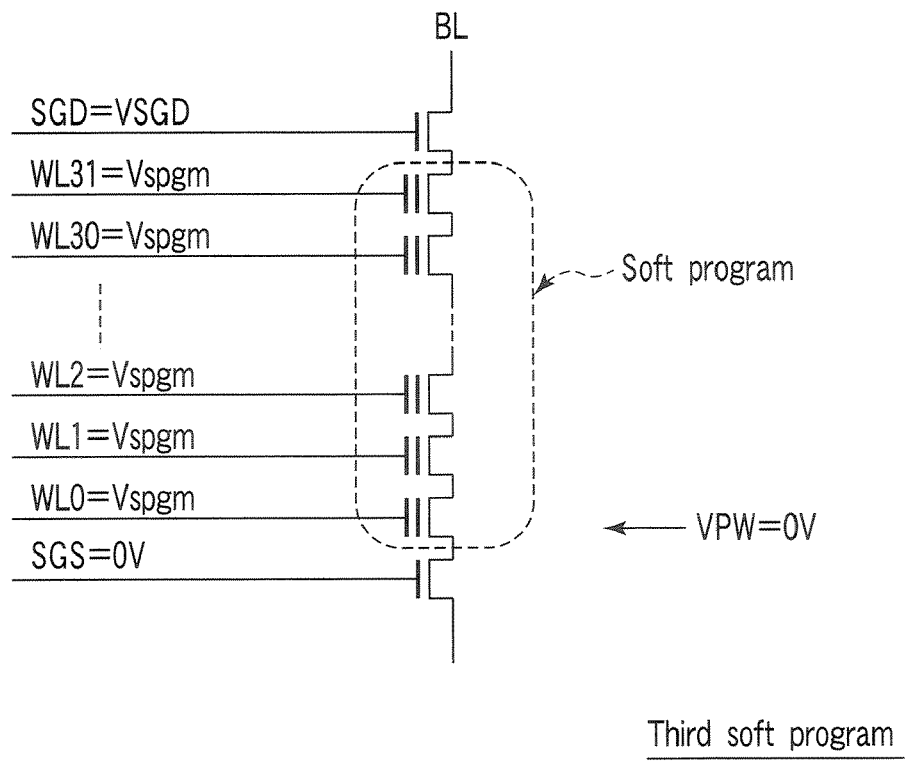
FIG. 18 is a circuit diagram showing a NAND cell included in the flash memory according to the third embodiment of the invention, and showing a state in a third soft program.
Figure 19:
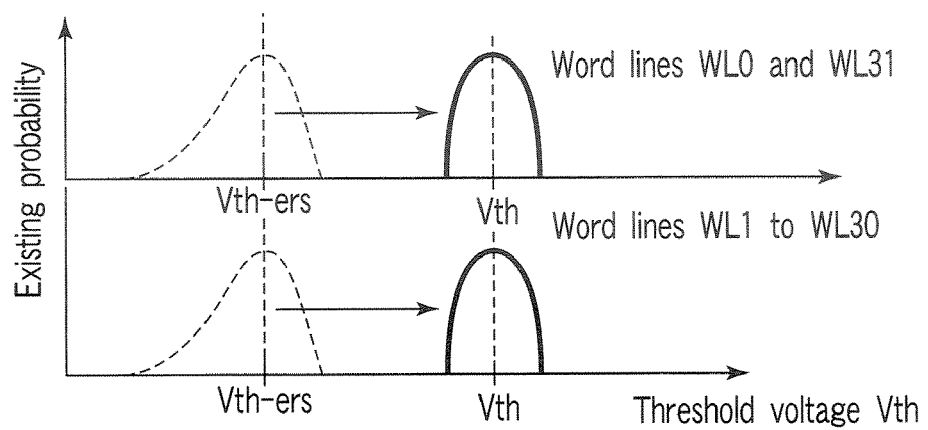
FIG. 19 is a graph showing the threshold distribution of the memory cell included in the flash memory according to the third embodiment of the invention, and showing a change in threshold during the third soft program.

Then, a third soft program is executed (Step S20). The third soft program means a process of equally raising the thresholds to all the memory cells MT0 to MT31 like other soft programs. FIG. 18 shows the state when Step S20 is performed. FIG. 18 is a circuit diagram showing the NAND cell. As shown in FIG. 18, the row decoder 3 applies the voltage VSGD to the selection gate line SGD, and applies the voltage Vspgm to the word lines WL0 to WL31. As a result, electrons are injected into the floating gates of the memory cell transistors MT0 to MT31 to raise the threshold voltage from the erase level Vth-ers. FIG. 19 shows the threshold distribution when the third soft program terminates. As shown in FIG. 19, the thresholds of all the memory cell transistors MT0 to MT31 are equally raised.

Then, the first verification described in the second embodiment is performed (Step S21), and the second verification described in the second embodiment is performed (Step S22). Steps S21 and S22 may be reversed. When the threshold voltage does not reach the predetermined value in the first and second verifications (NO in Step S23), the flow returns to Step S20 to re-execute the third soft program. That is, Steps S20 to S22 are repeated until the thresholds of the memory cell transistors MT0 and MT31 become Vth0 or until the thresholds of the memory cell transistors MT1 to MT30 become Vth0'.

When either the first or second verification becomes affirmative (YES in Step S23) and, at the same time, when only the first verification becomes affirmative (YES in Step S24), the second soft program is executed (Step S25). That is, since the thresholds of the memory cell transistors MT1 to MT30 have become the predetermined value (Vth0'), the threshold is set for the remaining memory cell transistors MT0 and MT31. Then, the second verification is performed (Step S26). When the threshold becomes Vth0 (YES in Step S27) the process is ended. When the threshold does not become Vth0 (NO in Step S27), the flow returns to Step S25 to repeat Steps S25 and S26.

In Step S24, when only the second verification becomes affirmative (No in Step S24), the first soft program is executed (Step S28). That is, because the thresholds of the memory cell transistors MT0 and MT31 have become the predetermined value (Vth0), the threshold is set for the remaining memory cell transistors MT1 to MT30. The first verification is performed (Step S29). When the threshold becomes Vth0'(YES in Step S30), the process is ended. When the threshold does not become Vth0' (NO in Step S30), the flow returns to Step S28 to repeat Steps S28 and S29.

The threshold distribution described in the first embodiment is also obtained by the method of the third embodiment. The details of the first soft program, second soft program, first verification, and second verification are similar to those described in the second embodiment.

Fourth Embodiment

Figure 20:
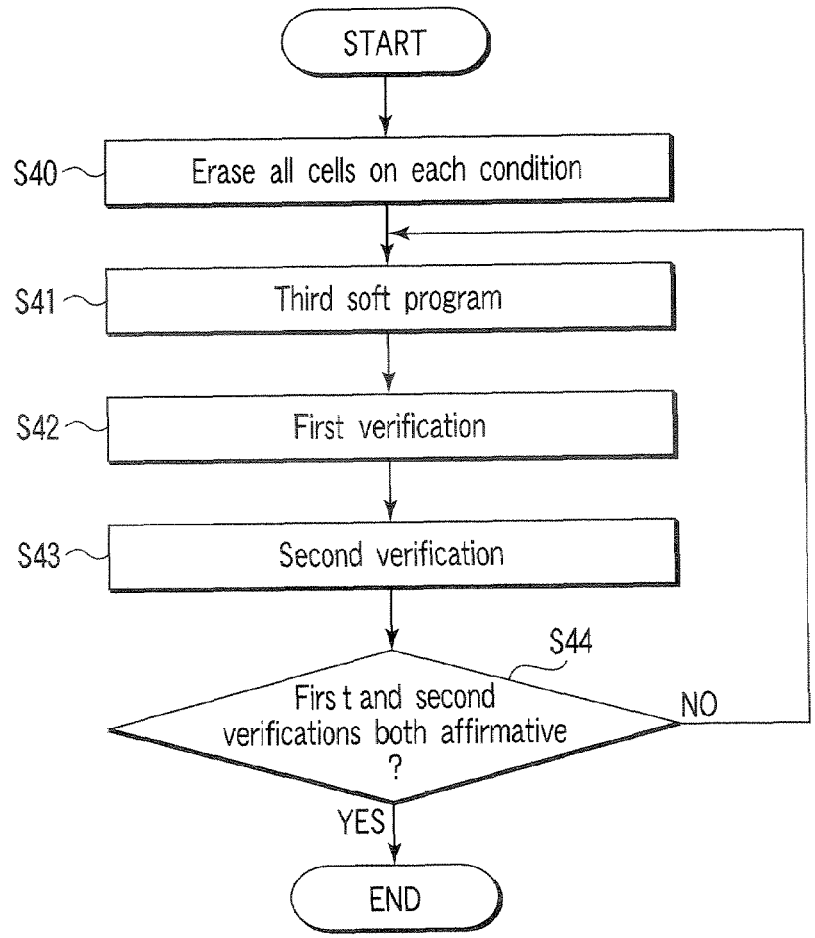
FIG. 20 is a flowchart showing a threshold setting method in a flash memory according to a fourth embodiment of the invention.

A semiconductor storage device according to a fourth embodiment of the invention will be described below. The fourth embodiment relates to a method of realizing the threshold distribution shown in FIG. 4 of the first embodiment, the method being different from those of the second and third embodiments. FIG. 20 is a flowchart showing the threshold setting method according to the fourth embodiment. In the fourth embodiment, the setting of the threshold distribution is also performed during the data erase.

Figure 21:
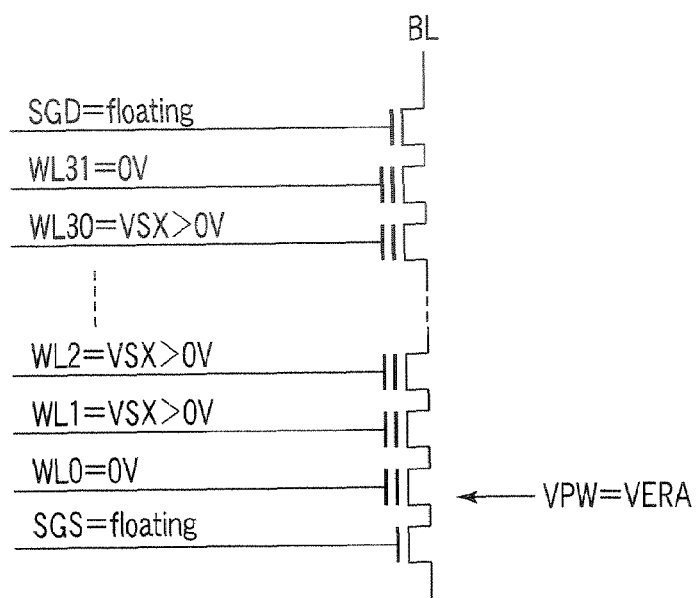
FIG. 21 is a circuit diagram showing a NAND cell included in the flash memory according to the fourth embodiment of the invention, and showing a state during erasing.

The data of all the memory cell transistors MT0 to MT31 are erased (Step S40). At this point, unlike the second and third embodiments, the memory cell transistors MT0 and MT31 differ from the memory cell transistors MT1 to MT30 in the erase condition. The state of Step S40 is shown in FIG. 21. FIG. 21 is a circuit diagram showing the NAND cell in performing Step S40.

As shown in FIG. 21, the row decoder 3 sets the selection gate lines SGD and SGS to the floating state, applies 0 V to the word lines WL0 and WL31, and applies a voltage VSX (>0 V) to the word lines WL1 to WL30. The well driver 15 applies the erase voltage VERA (for example, 20 V) to VPW. That is, the potential difference between the gates of the memory cell transistors MT0 and MT31 and the p-type well region 22 is set larger than the potential difference between the gates of the memory cell transistors MT1 to MT30 and the p-type well region 22. As a result, the memory cell transistors MT0 and MT31 are erased deeper than the memory cell transistors MT1 to MT30.

Figure 22:
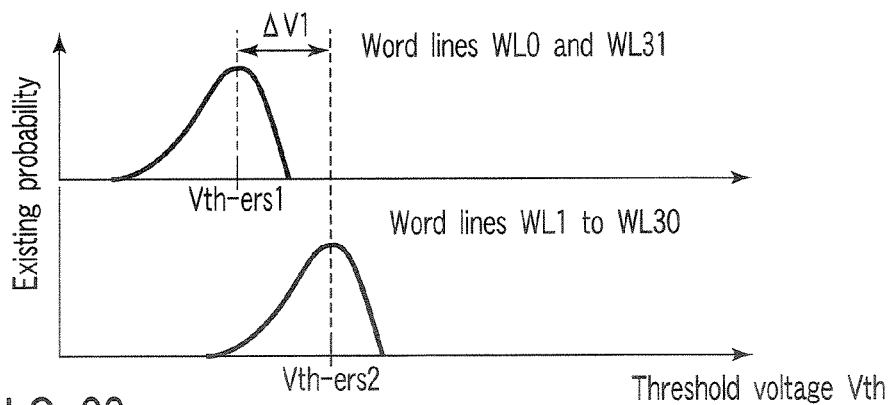
FIG. 22 is a graph showing the threshold distribution of the memory cell included in the flash memory according to the fourth embodiment of the invention, and showing a change in threshold during the erasing.

FIG. 22 shows the threshold distribution obtained as a result of Step S40. As shown in FIG. 22, the threshold voltage of the memory cell transistors MT0 and MT31 is a first erase level Vth-ers1. On the other hand, the threshold voltage of the memory cell transistors MT1 to MT30 becomes a second erase level Vth-ers2 which is higher than the first erase level Vth-ers1 by $\Delta V1$.

Because the difference of $\Delta V1$ is generated between the memory cell transistors MT0 and MT31 and the memory cell transistors MT1 to MT30 when Step S40 is ended, the threshold voltages can equally be shifted to desired ranges. Accordingly, the third soft program described in the third embodiment is executed (Step S41). The threshold voltages of the memory cell transistors MT0 to T31 are equally raised by the third soft program. Then, the first and second verifications are performed (Steps S42 and S43). Obviously either Step S42 or S43 may be performed first. When both the first and second verification become affirmative (YES in Step S44), the process is ended. When either the first or second verification does not become affirmative (NO in Step S44), Steps S41 to S43 are repeated.

The threshold distribution described in the first embodiment is also obtained by the method of the fourth embodiment.

Fifth Embodiment

Figure 23:
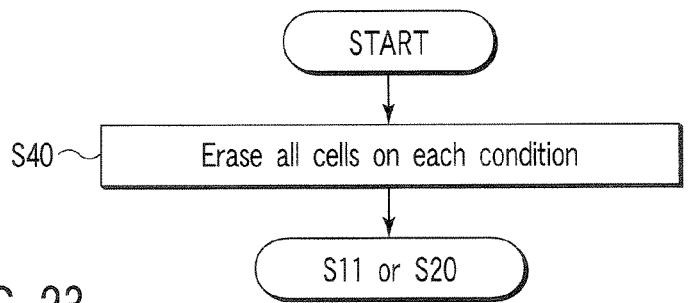
FIG. 23 is a flowchart showing a threshold setting method in a flash memory according to a fifth embodiment of the invention.

A semiconductor storage device according to a fifth embodiment of the invention will be described below. The fifth embodiment relates to a method of realizing the threshold distribution shown in FIG. 4 of the first embodiment, the method being different from those of the second to fourth embodiments. FIG. 23 is a flowchart showing the threshold setting method according to the fifth embodiment. In the fifth embodiment, the setting of the threshold distribution is also performed during the data erase.

Step S40 described in the fourth embodiment is performed. That is, the erase conditions are changed between the memory cell transistors MT0 and MT31 and the memory cell transistors MT1 to MT30 to obtain the threshold distribution shown in FIG. 22. Then, the flow goes to Step S11 of the second embodiment or to Step S20 of the third embodiment. The subsequent processes are similar to those of the second or third embodiment.

The threshold distribution described in the first embodiment is also obtained by the method of the fifth embodiment.

Sixth Embodiment

Figure 24:
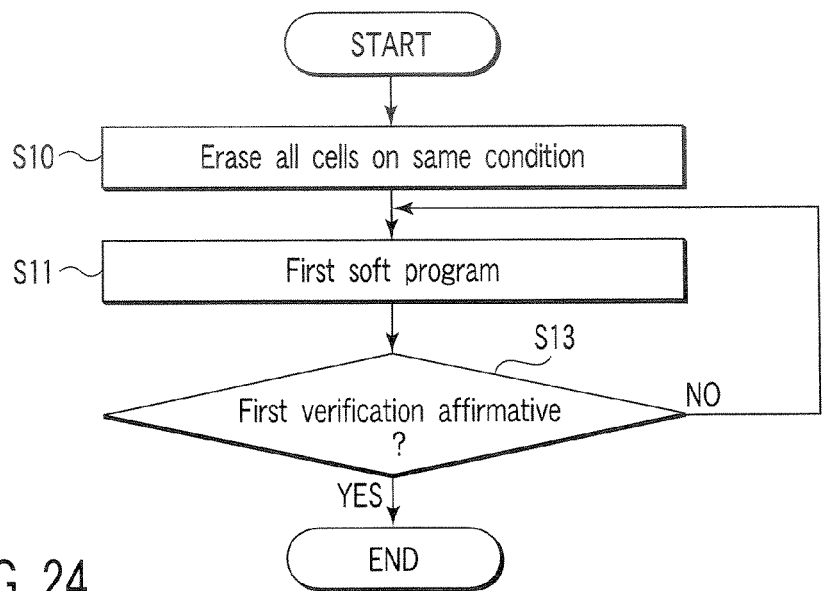
FIG. 24 is a flowchart showing a threshold setting method in a flash memory according to a sixth embodiment of the invention.

A semiconductor storage device according to a sixth embodiment of the invention will be described below. FIG. 24 is a flowchart showing the threshold setting method according to the sixth embodiment.

As shown in FIG. 24, in the method of the sixth embodiment, Step S12 and the processes from Step S14 are omitted in the method shown in FIG. 8 of the second embodiment. That is, after the data of all the memory cell transistors MT0 to MT31 are erased on the same condition, only the first soft program is executed. Therefore, the obtained threshold distribution is shown in FIG. 25. As shown in FIG. 25, the threshold voltage of the memory cell transistors MT0 and MT31 is the erase level Vth-ers which is lower than the threshold voltage Vth0' of the memory cell transistors MT1 to MT30.

The threshold voltage difference can also be provided between the memory cell transistors MT0 and MT31 and the memory cell transistors MT1 to MT30 by the method of the sixth embodiment.

Seventh Embodiment

A semiconductor storage device according to a seventh embodiment of the invention will be described below. The seventh embodiment differs from the second to sixth embodiments in that the threshold voltage difference is provided in the data write operation. FIG. 26 is a flowchart showing the data write operation according to the seventh embodiment. In the seventh embodiment, the soft program is not executed after the data erase. Accordingly, the threshold voltages of all the memory cell transistors MT0 to MT31 become Vth-ers in the erase state.

The row decoder 3 confirms whether or not the row address RA corresponds to the word lines WL0 and WL31 (Step S50). When the row address RA does not correspond to the word lines WL0 and WL31, namely, when the word lines WL1 to WL30 are selected (NO in Step S51), the data is written with a first write voltage Vpgm1 (Step S52). On the other hand, when the word lines WL0 and WL31 are selected (YES in Step S51), the data is written with a second write voltage Vpgm2 which is lower than the first write voltage Vpgm1 (Step S53).

The above write method will be described using the change in threshold voltage of the memory cell transistor MT. FIG. 27 is a graph showing the threshold distribution of the memory cell transistors MT0 to MT31 in the erase state, the threshold distribution of the memory cell transistors MT0 and MT31 after the data write, and the threshold distribution of the memory cell transistors MT1 to MT30 after the data write.

As shown in FIG. 27, the threshold voltage of the memory cell transistors MT1 to MT30 is set to Vth0' from the erase level Vth-ers in writing the "0" data. On the other hand, the threshold voltage of the memory cell transistors MT0 and MT31 is set to Vth0 from the erase level Vth-ers in writing the "0" data. Because the first write voltage Vpgm1 is larger than the second write voltage Vpgm2, Vth0' becomes larger than Vth0.

The threshold distribution described in the first embodiment is also obtained by the method of the seventh embodiment.

Alternatively, the threshold voltage of the memory cell transistors MT0 to MT31 in the erase state may be set to Vth0 by executing the third soft program during the data erase. FIG. 28 shows such cases. FIG. 28 is a graph showing the threshold distribution of the memory cell transistors MT0 to MT31 in the erase state, the threshold distribution of the memory cell transistors MT0 and MT31 after the data write, and the threshold distribution of the memory cell transistors MT1 to MT30 after the data write.

As shown in FIG. 28, the threshold voltage of the memory cell transistors MT1 to MT30 is set to Vth0' from the erase level Vth-ers in writing the "0" data. On the other hand, the threshold voltage of the memory cell transistors MT0 and MT31 is not changed in writing the "0" data.

Eighth Embodiment

Figure 29:
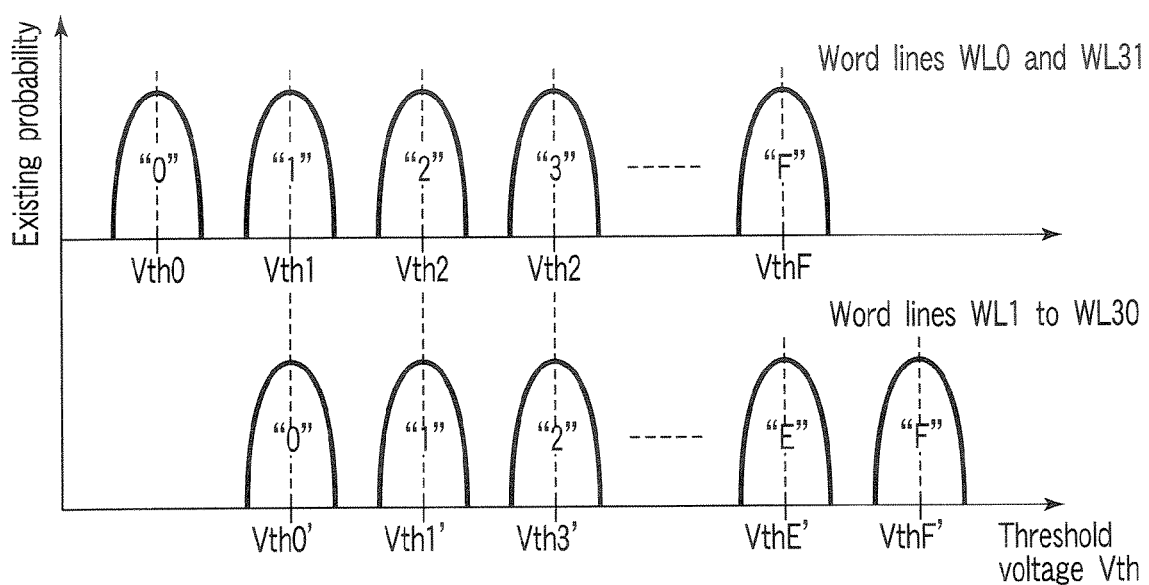
FIG. 29 is a graph showing the threshold distribution of a memory cell included in a flash memory according to an eighth embodiment of the invention.

A semiconductor storage device according to an eighth embodiment of the invention will be described below. The eighth embodiment relates to a threshold voltage interval in the first to seventh embodiments. FIG. 29 is a graph showing the threshold distribution of a NAND-type flash memory according to the eighth embodiment, and showing the memory cell transistors MT0 and MT31 connected to the word lines WL0 and WL31 and the memory cell transistors MT1 to MT30 connected to the word lines WL1 to WL30.

As shown in FIG. 29, like the first embodiment, the threshold voltage of the memory cell transistors MT1 to MT30 retaining the "0" data is set higher than that of the memory cell transistors MT0 and MT31 retaining the "0" data. The threshold voltages of the memory cell transistors MT0 and MT31 retaining the "1" data to the "F" data are set equal to those of the memory cell transistors MT0 and MT31 retaining the "0" data to the "E" data, respectively. The threshold voltage of the memory cell transistors MT1 to MT30 retaining the "F" data is set higher than that of the memory cell transistors MT0 and MT31 retaining the "F" data.

In other words, the memory cell transistor MT can retain 17 levels of data of "0" data, "1" data, "2" data, . . . , "9" data, "A" data, "B" data, . . . , "E" data, "F" data, and "10" data. In the memory cell transistors MT0 and MT31, the "0" data to the "F" data are provided using the 16 levels of "0" to "F" which have the lower thresholds in the 17 levels. On the other hand, in the memory cell transistors MT1 to MT30, the "0" data to the "F" data are provided using the 16 levels of "1" to "10" which have the higher thresholds in the 17 levels.

The NAND-type flash memory having the configuration of the eighth embodiment obtains the following effect (3) in addition to the effects (1) and (2) of the first embodiment.

(3) The configuration of the NAND-type flash memory can be simplified.

According to the configuration of the eighth embodiment, a part of the threshold voltage of the memory cell transistors MT0 and MT31 is equalized to a part of the threshold voltage of the memory cell transistors MT1 to MT31. In the case shown in FIG. 29, the operation condition in writing the "2" data in the memory cell transistors MT0 and MT31 and the operation condition in reading the "2" data are respectively identical to the operation condition in writing the "1" data in the memory cell transistors MT0 to MT30 and the operation condition in reading the "1" data. Accordingly, the method of evaluating the threshold setting level and the settings of the normal write and read operation conditions can be simplified, which allows the configuration to be simplified in the flash memory.

According to the configuration of the eighth embodiment, the threshold voltage difference between the data of the memory cell transistors MT0 and MT31 is equal to the threshold voltage difference between the data of the memory cell transistors MT1 to MT30. Accordingly, a data retention margin can be ensured. That is, although the number of data to be retained by the memory cell is increased to the 17 levels from the conventional 16 levels, a width (margin) of the threshold voltage to be set to each data is not changed, so that the generation of the false write or the false read can be prevented.

Ninth Embodiment

Figure 30:
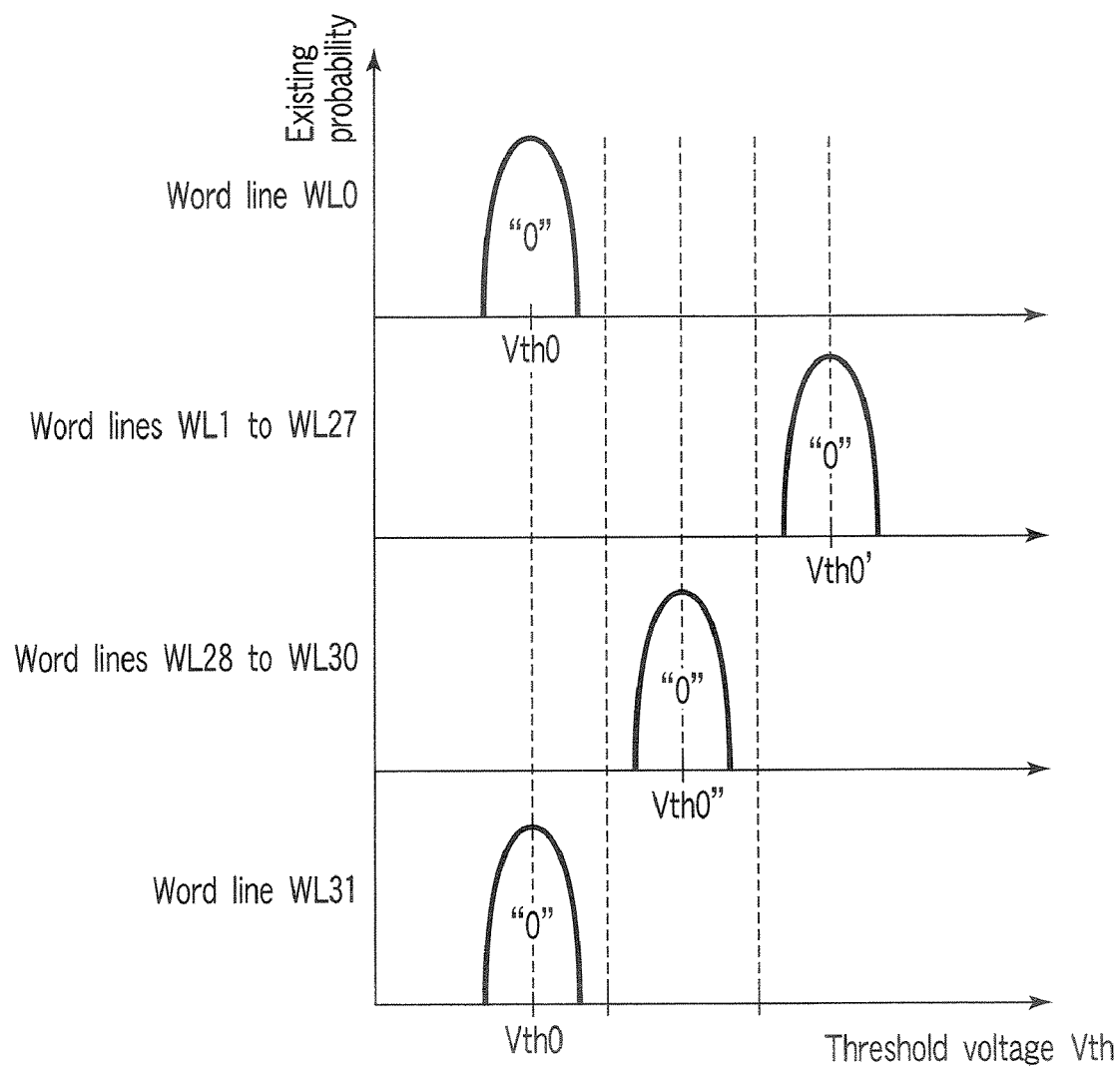
FIG. 30 is a graph showing the threshold distribution of a memory cell included in a flash memory according to a ninth embodiment of the invention, and showing a threshold when "0" data is retained.

A semiconductor storage device according to a ninth embodiment of the invention will be described below. In the ninth embodiment, the "0" data threshold of the memory cell transistors MT1 to MT30 of the first to eighth embodiments is lowered as the memory cell transistors MT1 to MT30 are brought close to the selection gate line SGD. FIG. 30 is a graph showing the "0" data threshold of the NAND-type flash memory according to the ninth embodiment. FIG. 30 also shows the memory cell transistor MT0 connected to the word line WL0, the memory cell transistors MT1 to MT27 connected to the word lines WL1 to WL27, the memory cell transistors MT28 to MT30 connected to the word lines WL28 to WL30, and the memory cell transistor MT31 connected to the word line WL31.

As shown in FIG. 30, as with the first to eighth embodiments, the thresholds of the memory cell transistors MT1 to MT30 retaining the "0" data are set higher than that of the memory cell transistors MT0 and MT31 retaining the "0" data. In the ninth embodiment, the difference of the "0" data threshold is provided even in the memory cell transistors MT0 to MT30. That is, "0" data threshold Vth0" of the memory cell transistors MT28 to MT30 connected to the word lines WL28 to WL30 is set smaller than the "0" data threshold Vth0' of the memory cell transistors MT1 to MT27 connected to the word lines WL1 to WL27 which are located on the source line side of the word lines WL28 to WL30. In other words, the lower limit value of the "0" data threshold Vth0" of the memory cell transistors MT28 to MT30 is higher than the upper limit value of the "0" data threshold Vth0 of the memory cell transistors MT0 and MT31, and the upper limit value of Vth0" is set lower than the lower limit value of the "0" data threshold Vth0' of the memory cell transistors MT1 to MT27.

The threshold distribution of the ninth embodiment can be realized by the methods of the first to eighth embodiments. For example, in the methods of FIGS. 8, 7, and 24, the first soft program and first verification are separately executed on the different conditions to the memory cell transistors MT1 to MT27 and the memory cell transistors MT28 to MT30. That is, the first soft program and first verification are executed with respect to the memory cell transistors MT1 to MT27 such that the "0" data threshold becomes Vth0'. On the other hand, the first soft program and first verification are executed with respect to the memory cell transistors MT28 to MT30 such that the "0" data threshold becomes Vth0".

The erase condition of Step S40 in the method of FIGS. 20 and 23 is changed between the memory cell transistors MT1 to MT27 and the memory cell transistors MT28 to MT30. Specifically, during the erase, the voltage at the word lines WL28 to WL30 is set higher than the voltage at the word lines WL1 to WL27. Therefore, the erase level of the memory cell transistors MT28 to MT30 is set deeper than the erase level of the memory cell transistors MT1 to MT27 (threshold voltage is set lower). Like the cases shown in FIGS. 8 and 17, the first verification is separately performed on the different conditions to the memory cell transistors MT1 to MT27 and the memory cell transistors MT28 to MT30.

In the method of FIG. 26, when the determination becomes negative in Step S51, it is further determined whether the row address corresponds to the word lines WL1 to WL27 or the word lines WL28 to WL30. When the row address corresponds to the word lines WL1 to WL27, the flow goes to Step S52. When the row address corresponds to the word lines WL28 to WL30, the data is written using a third write voltage Vpgm3. The third write voltage Vpgm3 is one which satisfies the condition of Vpgm2<Vpgm3<Vpgm1.

The NAND-type flash memory having the configuration of the ninth embodiment obtains the following effect (4) in addition to the effects (1) and (2) of the first embodiment and the effect (3) of the eighth embodiment.

(4) The data write reliability can be improved (part 3).

As described above, in the self-boost type, the boost efficiency is decreased by using the memory cell in which the data is written to raise the threshold. Therefore, conventionally there is proposed a technique in which the channel of the memory cell on the source line side is cut off from the selection memory cell to improve the boost efficiency using only the erase cell. However, there are the following problems in the write type of the proposed technique. That is, the source side cannot be cut off, the false write caused by GIDL is possibly generated, and the false write is easily generated when the data is written in the memory cell located close to the drain side (bit line side).

Figure 31:
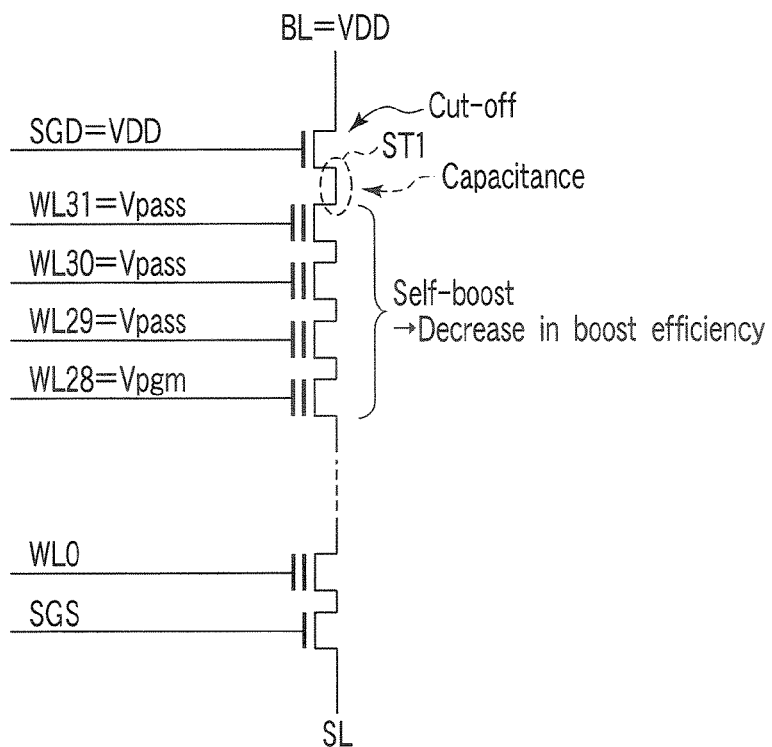
FIG. 31 is a circuit diagram showing a NAND cell included in the flash memory according to the ninth embodiment of the invention.

The problems will specifically be described with reference to FIG. 31. FIG. 31 is a circuit diagram showing the NAND cell including the memory cell (non-selected memory cell) in which the data should not be written, and particularly showing the state of the write operation when the word line WL28 is selected.

The selection transistor ST1 is cut off in the NAND cell including the non-selected memory cell. In this case, a capacitance between the word line WL31 and the selection gate line SGD worsens the boost efficiency. When the data is written in the word lines (word lines WL0, WL1, and the like) close to the source line SL, the self-boost is performed using a number of memory cells in the erase state. Therefore, the capacitance between the word line WL31 and the selection gate line SGD is relatively small, and the influence of the capacitance is not so large. However, when the data is written in the word lines (word lines WL28, WL29, WL30, WL31, and the like) close to the bit line BL, the capacitance between the word line WL31 and the selection gate line SGD becomes relatively large. As a result, the boost efficiency decreases compared with the case in which the data is written in the word line close to the source line SL. Therefore, the potential at the channel is not sufficiently raised due to a lack of boost, and thereby the false data write is possibly generated.

There is also a method of eliminating the lack of boost by raising the voltage Vpass. However, when the voltage Vpass is raised, in the NAND cell including the selected memory cell, there is generated a problem in that the false write is generated in the non-selected memory cell connected to the non-selected word line to which the voltage Vpass is applied. Therefore, it is very difficult to properly set the voltage Vpass.

However, according to the configuration of the ninth embodiment, the "0" data threshold of the memory cell transistor close to the bit line BL is set lower than (set to the negative side rather than) that of the memory cell transistor close to the source line SL. When the word line close to the bit line BL is selected, the boost is performed using the erase memory cell (memory cell transistor retaining the "0" data) whose "0" data threshold is lower, which allows the boost efficiency to be enhanced. Therefore, the influence of the capacitance between the word line WL31 and the selection gate line SGD which causes the decrease in boost efficiency can be lessened. Referring to FIG. 31, the self-boost is performed using the memory cell transistors MT28 to MT31 when the word line WL28 is selected. At this point, because the threshold voltage of the memory cell transistors MT28 to MT30 is set lower than ever before (Vth0"<Vth0'), the capacitance between the word line WL31 and the selection gate line SGD is relatively lowered than ever before to improve the boost efficiency. Therefore, the channel potential can sufficiently be raised to suppress the false data write. The setting margin of the voltage Vpass is also widened.

Figure 32:
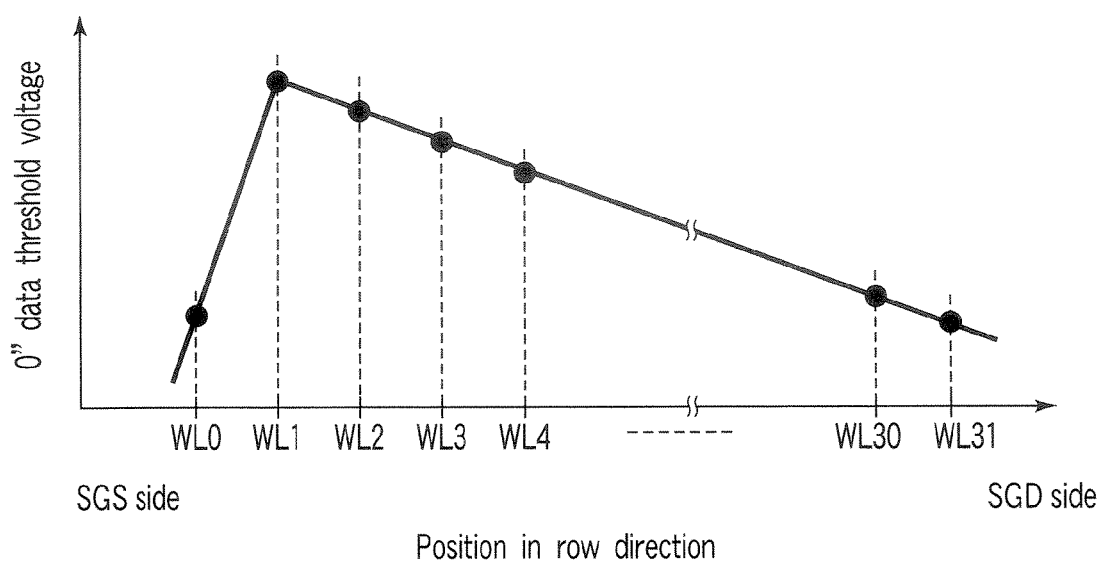
FIG. 32 is a graph showing the threshold distribution of the memory cell included in the flash memory according to the ninth embodiment of the invention, and showing a threshold when the "0" data is retained in a row direction.

Although the erase level is changed between the word lines WL1 to WL27 and the word lines WL28 to WL30 in the ninth embodiment, it is possible to appropriately set which word line the erase level is changed for. In the word lines WL1 to WL30, not only two erase levels but at least three erase levels may be changed in each word line. As shown in FIG. 32, the erase levels may be decreased in ascending order of the word lines WL1 to WL30. In FIG. 32, horizontal axis indicates a position in the row direction, and the vertical axis indicates the "0" data threshold. However, the erase level may be decreased only for the memory cell in which the capacitance between the word line WL31 and the selection gate line SGD becomes troublesome compared with other memory cells.

Tenth Embodiment

A semiconductor storage device according to a tenth embodiment of the invention will be described below. The tenth embodiment relates to an update sequence according to the data in the first to ninth embodiments. FIG. 33 is a graph showing the threshold voltage distribution of the NAND-type flash memory according to the tenth embodiment.

As shown in FIG. 33, because each memory cell can retain four-bit data, the memory cell retains the 16 levels of data of the "0" data to the "F" data. It is assumed that the lower limit values of the threshold voltages of the "0" data to the "F" data are 1 to F (volts) respectively.

Figure 34:
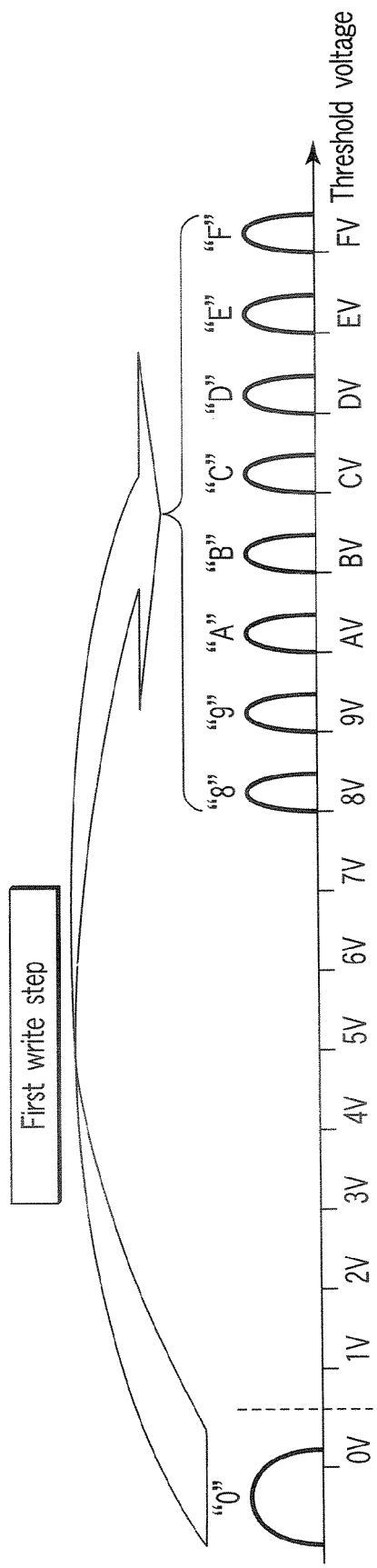
FIGS. 34 and 35 are graphs showing the threshold distributions of the memory cells included in the flash memory according to the tenth embodiment of the invention, and showing states of first and second write steps, respectively.
Figure 35:
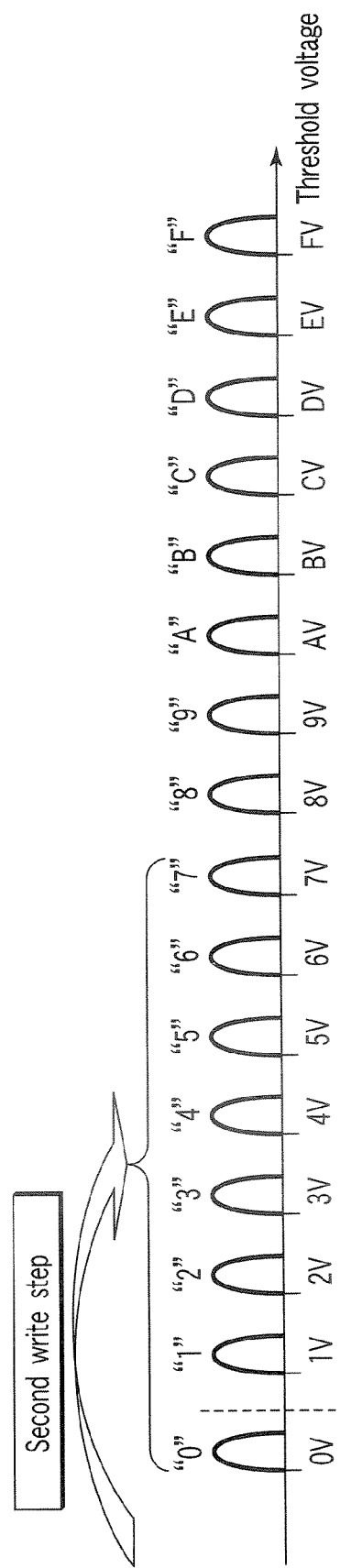

In the tenth embodiment, in the case where the data is written in the word line WL0 or WL31 in which the false write is possibly generated by GIDL, the data is written by two steps of a first write step and a second write step. The first write step and the second write step will be described with reference to FIGS. 34 and 35. FIGS. 34 and 35 show the threshold distributions.

As shown in FIG. 34, in the first write step, the data having the higher threshold voltage, e.g., the "8" data to the "F" data are written. At this point, the write inhibition is performed to the memory cell which is connected to the same word line to write the "0" data to the "7" data.

When the first write step is ended, the second write step is performed. As shown in FIG. 35, in the second write step, the data having the lower threshold voltage which is not written in the first write step, e.g., the "0" data to the "7" data are written. At this point, no electrons are injected into the floating gate for the memory cell which is connected to the same word line and in which the "8" data to the "F" data are written. It is not particularly necessary to write the "0" data.

The NAND-type flash memory having the configuration of the tenth embodiment obtains the following effect (5) in addition to the effects (1) and (2) of the first embodiment, the effect (3) of the eighth embodiment, and the effect (4) of the ninth embodiment.

(5) The data write reliability can be improved (part 4)

As described above, when the data is written in the memory cell adjacent to the selection transistor ST2 on the source side, electrons are generated by GIDL and accumulated in the floating gate, which causes the false write. In the NAND-type flash memory, usually the data is written in a page unit. That is, the data is collectively written in the plural memory cell transistors MT connected to the one word line WL. Accordingly, when the "F" data for which the higher write voltage is required is written in a certain column after the "1" data is written in another column, the false write is possibly performed to the previously written "1" data by GIDL.

On the contrary, in the tenth embodiment, when the data is written in the word lines WL0 and WL31 in which the GIDL becomes troublesome, the data having the higher threshold voltage, i.e., the write operation for which the higher write voltage is required is performed first as the first write step. Then, the data having the lower threshold voltage, i.e., the write operation for which the lower write voltage is required is performed as the second write step. In the second write step, the higher write voltage is not applied to the word line, so that the generation of GIDL can be suppressed.

In the case where the "0" data is not written in the second write step, the false write is possibly generated by GIDL in the first write step. In such cases, it is only necessary that threshold voltage difference between the "0" data and "1" data be larger than other threshold voltage differences. Therefore, the data can correctly be read even if the false write is generated to raise the threshold.

In the write sequence of the tenth embodiment, because the write speed is possibly delayed, the write sequence is performed only to the particular word line WL in which the generation of GIDL becomes troublesome. Particularly the write sequence of the tenth embodiment is performed to the memory cell adjacent to the selection transistor on the source side, or to the memory cell adjacent to the selection transistor on the drain side if needed.

Although the memory cell transistor MT can retain the 16-levels data in the tenth embodiment, the embodiment is not limited to the memory cell transistor MT having the 16-levels data. That is, the memory cell transistor MT can retain the $2^n$-levels data from "0" to "$2^n-1$" (n is a natural number more than 1) according to the threshold voltage. At this point, it is assumed that the threshold voltage of the memory cell transistor is increased in ascending order from the "0" data to "$2^n-1$".

The write operation is performed by the following sequence when the data is written in the memory cell transistor MT connected to the word lines WL0 and WL31 adjacent to the selection gate lines SGS and SGD. The write operation is collectively performed to the memory cell transistors MT in which the "$2^n/2$" data to the "$2^n-1$" data should be written (first write step), and the write operation is performed to the memory cell transistors MT in which the "0" data to "$(2^n/2)-1$" data should be written (second write step).

The write operation is performed under the control of the control circuit 10 shown FIG. 1. The control circuit 10 monitors the write data inputted to the input and output buffer 9, and issues a command to the row decoder 3 as to which word line WL should be applied with the write voltage, according to the data transferred to each bit line BL.

Figure 36:
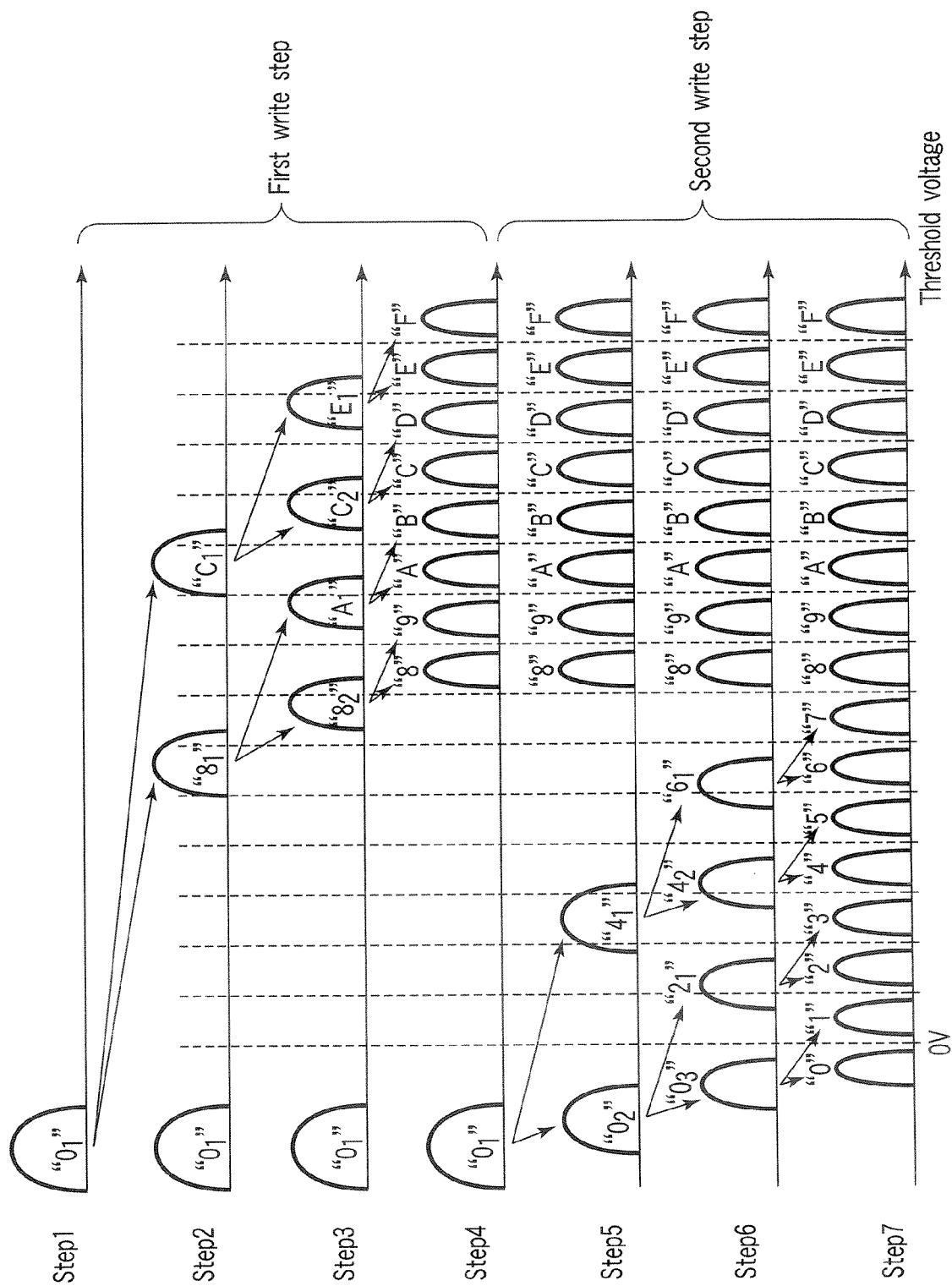
FIG. 36 is a graph showing the threshold distribution of the memory cell included in the flash memory according to the tenth embodiment of the invention, and showing a change in threshold voltage during the data write.

The first and second write steps will be described in detail with reference to FIG. 36. FIG. 36 shows the threshold distribution of the memory cell transistor, and shows the change in threshold voltage during the first and second write steps.

As shown in FIG. 36, the memory cell transistor MT is in the erase state (Step 1 in FIG. 36). In this state, it is assumed that the memory cell transistor retains the "$0_1$" data.

First, the "8" data to the "F" data are written in the memory cell transistor.

Electrons are injected into the floating gate for the memory cell transistor MT in which the pieces of data to be written are the "8" data to the "B" data, and "$8_1$" data is written. The "$8_1$" data has the threshold voltage lower than that of the "9" data. On the other hand, electrons are injected into the floating gate for the memory cell transistor MT in which the pieces of data to be written are the "C" data to the "F" data, and "$C_1$" data is written. The "$C_1$" data has the threshold voltage higher than that of the "$8_1$" data while having the threshold voltage lower than that of the "D" data (Step 2 in FIG. 36).

Then, electrons are injected into the floating gate for the memory cell transistor MT in which the data to be written is the "8" data or the "9" data, and the "$8_1$" data is updated to "$8_2$" data. The "$8_2$" data has the threshold voltage lower than that of the "9" data. Electrons are injected into the floating gate for the memory cell transistor MT in which the data to be written is the "A" data or the "B" data, and the "$8_1$" data is updated to "$A_1$" data. The "$A_1$" data has the threshold voltage higher than that of the "$8_2$" data while having the threshold voltage lower than that of the "B" data (Step 3 in FIG. 36).

Electrons are injected into the floating gate for the memory cell transistor MT in which the data to be written is the "C" data or the "D" data, and the "$C_1$" data is updated to "$C_2$" data. The "$C_2$" data has the threshold voltage higher than that of the "$A_1$" data while having the threshold voltage lower than that of the "D" data. Electrons are injected into the floating gate for the memory cell transistor MT in which the data to be written is the "E" data or the "F" data, and the "$C_1$" data is updated to "$E_1$" data. The "$E_1$" data has the threshold voltage higher than that of "$C_2$" data while having the threshold voltage lower than that of "F" data (Step 3 in FIG. 36).

Electrons are injected into the floating gate for the memory cell transistor MT in which the data to be written is the "8" data or the "9" data, and the "$8_2$" data is updated to the "8" data and the "9" data. Electrons are injected into the floating gate for the memory cell transistor MT in which the data to be written is the "A" data or the "B" data, and the "$A_1$" data is updated to the "A" data and the "B" data (Step 4 in FIG. 36).

Electrons are injected into the floating gate for the memory cell transistor MT in which the data to be written is the "C" data or the "D" data, and the "$C_2$" data is updated to the "C" data and the "D" data. Electrons are injected into the floating gate for the memory cell transistor MT in which the data to be written is the "E" data or the "F" data, and the "$E_1$" data is updated to the "E" data or the "F" data (Step 4 in FIG. 36).

Thus, the write operation is completed for the "8" data to the "F" data (first write step).

Then, the "0" data to the "7" data are written in the memory cell transistor.

Electrons are injected into the floating gate for the memory cell transistor MT in which the pieces of data to be written are the "0" data to the "3" data, and "$0_2$" data is written. The "$0_2$" data has the threshold voltage lower than that of the "1" data. On the other hand, electrons are injected into the floating gate for the memory cell transistor MT in which the pieces of data to be written are the "0" data to the "7" data, and "$4_1$" data is written. The "$4_1$" data has the threshold voltage higher than that of the "$0_2$" data while having the threshold voltage lower than that of the "5" data (Step 5 in FIG. 36).

Then, electrons are injected into the floating gate for the memory cell transistor MT in which the data to be written is the "0" data or the "1" data, and the "$0_2$" data is updated to "$0_3$" data. The "$0_3$" data has the threshold voltage lower than that of the "1" data. Electrons are injected into the floating gate for the memory cell transistor MT in which the data to be written is the "2" data or the "3" data, and the "$0_2$" data is updated to "$2_1$" data. The "$2_1$" data has the threshold voltage higher than that of the "0₃" data while having the threshold voltage lower than that of the "3" data (Step 6 in FIG. 36).

Then, electrons are injected into the floating gate for the memory cell transistor MT in which the data to be written is the "4" data or the "5" data, and the "4₁" data is updated to "4₂" data. The "4₂" data has the threshold voltage lower than that of the "2₁" data and that of the "5" data. Electrons are injected into the floating gate for the memory cell transistor MT in which the data to be written is the "6" data or the "7" data, and the "4₁" data is updated to "6₁" data. The "6₁" data has the threshold voltage higher than that of the "4₂" data while having the threshold voltage lower than that of the "7" data (Step 6 in FIG. 36).

Then, electrons are injected into the floating gate for the memory cell transistor MT in which the data to be written is the "0" data or the "1" data, and the "0₃" data is updated to the "0" data to the "1" data. Electrons are injected into the floating gate for the memory cell transistor MT in which the data to be written is the "2" data or the "3" data, and the "2₁" data is updated to the "2" data to the "3" data (Step 7 in FIG. 36).

Then, electrons are injected into the floating gate for the memory cell transistor MT in which the data to be written is the "4" data or the "5" data, and the "4₂" data is updated to "4" data to the "5" data. Electrons are injected into the floating gate for the memory cell transistor MT in which the data to be written is the "6" data or the "7" data, and the "6₁" data is updated to the "6" data or the "7" data (Step 7 in FIG. 36).

In this manner, the write operation is completed for the "0" data to the "7" data (second write step).

Modification of Tenth Embodiment

The case in which the write sequence of the tenth embodiment is changed will be described below. In the tenth embodiment, each memory cell can retain the 16-levels data, i.e., the four-bit data. In such cases, the four pages are allocated to one word line when the data is collectively written in all the memory cells connected to a certain word line.

However, in the case where each memory cell can retain the four-bit data, eight pages may be allocated to one word line. In such cases, the data is collectively written in a half of the memory cells connected to one word line. The case in which not only are the data written in the memory cells connected to an even-number bit line but also written in the memory cells connected to an odd-number bit line will be described by way of example.

FIG. 37 is a circuit diagram showing the NAND cell. As shown in FIG. 37, the data is written in the memory cells connected to the even-number bit line by the first write step. Then, the data is written in the memory cells connected to the odd-number bit line by the second write step. Then, the data is written in the memory cells connected to the even-number bit line by a third write step. Then, the data is written in the memory cells connected to the odd-number bit line by a fourth write step.

The first to fourth write steps will be described with reference to FIGS. 38 to 41. FIGS. 38 to 41 show the threshold distributions.

Figure 38:
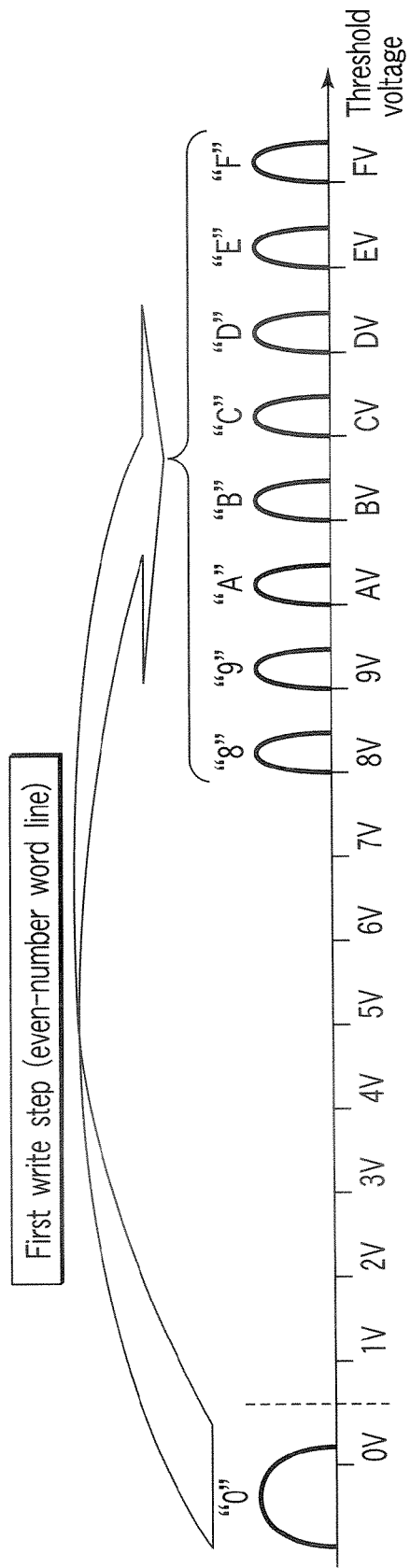

As shown in FIG. 38, in the first write step, the data having the higher threshold voltage, e.g., the "8" data to the "F" data are written in the memory cells connected to the even-number bit line. That is, the data of the upper two pages is written for the even-number bit line. At this point, the write inhibition is performed to the memory cells connected to the even-number bit line and the same word line and in which the "0" data to the "7" data should be written, and the write inhibition is also performed to the memory cells connected to the odd-number bit line.

Figure 39:
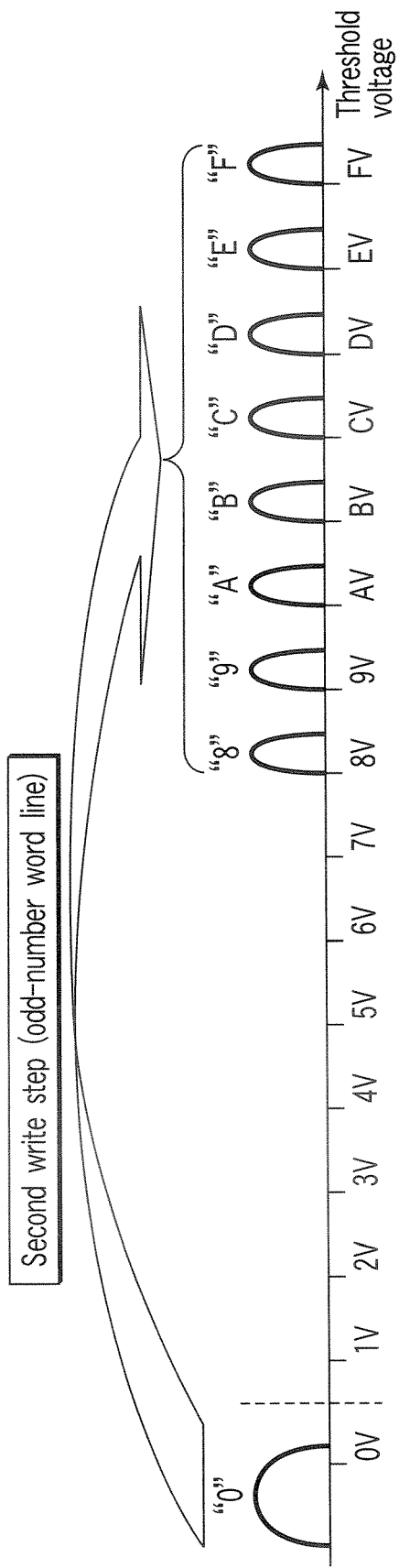

When the first write step is ended, the second write step is performed. As shown in FIG. 39, in the second write step, the data having the higher threshold voltage, e.g., the "8" data to the "F" data are written in the memory cells connected to the odd-number bit line. That is, the data of the upper two pages is written for the odd-number bit line. At this point, the write inhibition is performed to the memory cells connected to the odd-number bit line and the same word line and in which the "0" data to the "7" data should be written, and the write inhibition is also performed to the memory cells connected to the even-number bit line.

When the second write step is ended, the third write step is performed. As shown in FIG. 40, in the third write step, the data having the lower threshold voltage which is not written in the first write step, e.g., the "0" data to the "7" data are written in the memory cells connected to the even-number bit line. That is, the data of the lower two pages is written for the even-number bit line. At this point, no electrons are injected into the floating gate for the memory cells connected to the even-number bit line and the same word line and in which the "8" data to the "F" data are already written. It is not particularly necessary to write the "0" data.

When the third write step is ended, the fourth write step is performed. As shown in FIG. 41, in the fourth write step, the data having the lower threshold voltage which is not written in the second write step, e.g., the "0" data to the "7" data are written in the memory cells connected to the odd-number bit line. That is, the data of the lower two pages is written for the odd-number bit line. At this point, no electrons are injected into the floating gate for the memory cells connected to the odd-number bit line and the same word line and in which the "8" data to the "F" data are already written. It is not particularly necessary to write the "0" data.

Thus, the tenth embodiment can also be applied to the configuration in which the plural pages are allocated to one word line. In the tenth embodiment and the modification thereof, the "8" data to the "15" data and the "1" data (or the "0" data) to the "7" data are written by the two steps. However, like the "C" data to the "F" data and the "1" data (or the "0" data) to the "B" data, the data having a "k−1" level or less may be written after the data having a "k" level or more are written. In addition to the 16 levels of the "0" data to the "F" data (4 bit data), the tenth embodiment and the modification thereof can be applied not only to the eight levels of the "0" data to the "7" data (3 bit data) but also to the four levels of the "0" data to the "3" data (2 bit data).

Eleventh Embodiment

A semiconductor storage device according to an eleventh embodiment of the invention will be described below. In the eleventh embodiment, the data write sequence is changed in the tenth embodiment and the modification thereof. The configuration of the eleventh embodiment is similar to those of the tenth embodiment and the modification thereof except that the data write sequence is changed, so that the description in that respect is omitted.

FIG. 42 is a graph showing the threshold distribution of the memory cell, and showing states of first and second write steps. In FIG. 42, the threshold distributions of the data written by each step are shown by hatched lines. In the tenth embodiment, the "8" data to the "F" data are written in the first write step, and the "0" data to the "7" data are written in the second write step. That is, the number of levels of the data written by the first write step is equal to the number of levels of the data written by the second write step.

However, as shown in FIG. 42, for example, the "4" data to the "F" data may be written in the first write step while the "0" data to the "3" data are written in the second write step. That is, the number of levels of the data written by the first write step may differ from the number of levels of the data written by the second write step. In FIG. 42, the number of levels of the data written by the first write step is 12 levels ("4" data to "F" data), and the number of levels of the data written by the second write step is four levels ("0" data to "3" data). However, the number of levels of the data written by each step is not limited to the example of FIG. 42. It is only necessary that the data having the highest threshold voltage ("F" data in FIG. 42) be written in the first write step.

Figure 43:
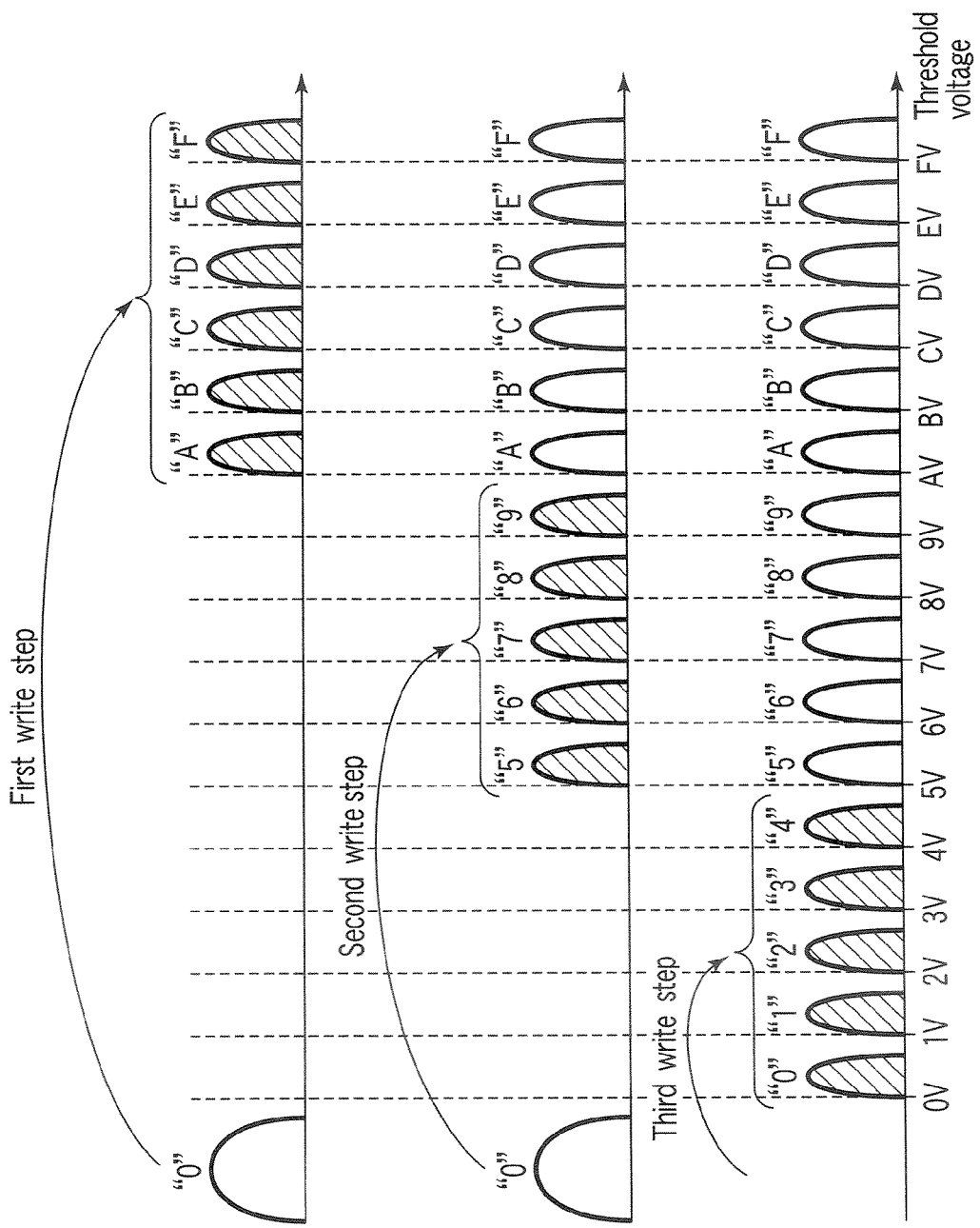
FIG. 43 is a graph showing the threshold distribution of the memory cell included in the flash memory according to the eleventh embodiment of the invention, and showing states of first to third write steps.

The data write operation is not limited to the two-step write. For example, the data may be written by a three-step write operation having the first to third write steps. The three-step write operation will be described with reference to FIG. 43. FIG. 43 is a graph showing the threshold distribution of the memory cell, and showing the states of first to third write steps. In FIG. 43, the threshold distributions of the pieces of data written by each step are shown by hatched lines. As shown in FIG. 43, the "A" data to the "F" data are written in the first write step, the "5" data to the "9" data are written in the second write step, and the "0" data to the "4" data are written in the third write step. In FIG. 43, the six levels of the data ("A" data to "F" data) are written by the first write step, and the five levels of the data are written by the second ("5" data to "9" data) and third write steps ("0" data to "4" data) respectively. However, the number of levels of the data written by each write step is not limited to the example of FIG. 43 as long as the data having the highest threshold voltage is written in the first write step.

Figure 44:
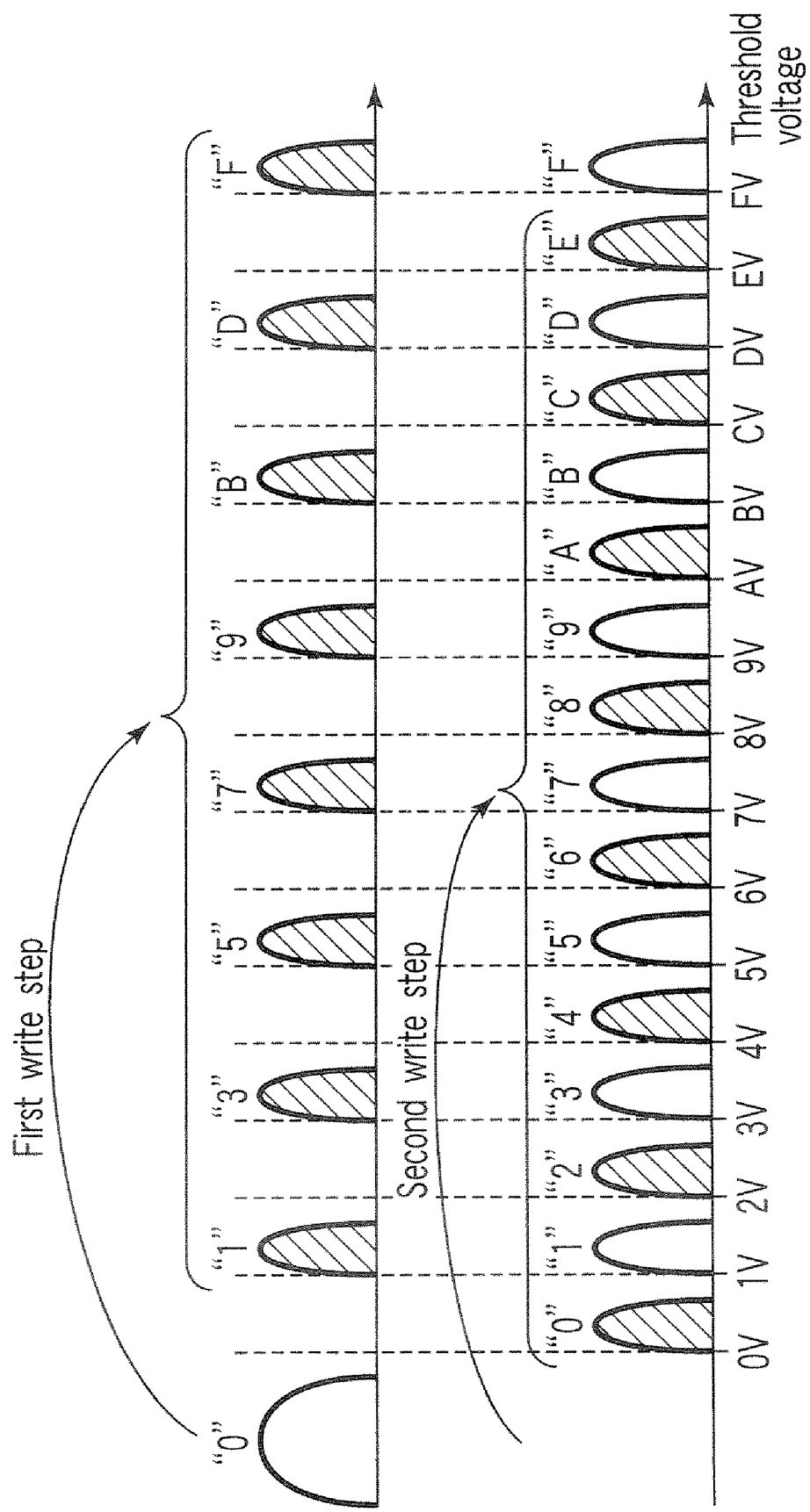
FIG. 44 is a graph showing the threshold distribution of the memory cell included in the flash memory according to the eleventh embodiment of the invention, and showing states of first and second write steps.

The plural levels of the data written in each write step are not limited to the case in which the levels of the data have the continuous threshold voltages. The case in which the levels of the data have the discontinuous threshold voltages will be described with reference to FIG. 44. FIG. 44 is a graph showing the threshold distribution of the memory cell, and showing the states of first and second write steps. In FIG. 44, the threshold distributions of the pieces of data written by each step are shown by hatched lines. As shown in FIG. 44, the "1" data, the "3" data, the "5" data, the "7" data, the "9" data, the "B" data, the "D" data, and the "F" data are written in the first write step, and the "0" data, the "2" data, the "4" data, the "6" data, the "8" data, the "A" data, the "C" data, and the "E" data are written in the second write step.

The same effect as the tenth embodiment is obtained by the above write method.

In the semiconductor storage device according to the first to eleventh embodiments of the invention, the threshold voltage of the data having the lowest threshold level is changed according to the word line in the multi-level NAND-type flash memory. Specifically, the threshold voltage of the memory cell transistor which is not adjacent to the selection gate line is set higher than the threshold voltage of the memory cell transistor adjacent to the selection gate line. Therefore, the memory cell transistor which is not adjacent to the selection transistor can surely be cut off during the self-boost, and thereby the boost efficiency can be improved. In the memory cell transistor adjacent to the selection transistor, the generation of the false write caused by the tunnel current can be suppressed.

The memory cell transistors MT0 and MT31 retaining the data are arranged adjacent to the selection gate lines SGD and SGS in the above embodiments. However, a dummy memory cell may be provided. FIG. 45 is a circuit diagram showing the NAND cell including the dummy cell. As shown in FIG. 45, a dummy cell transistor DT is provided between the selection transistor ST1 and the memory cell transistor MT31, and the dummy cell transistor DT is also provided between the selection transistor ST2 and the memory cell transistor MT0. The current path of the dummy cell transistor DT is connected in series between the current path of the memory cell transistor MT and the current path of the selection transistor, and the gate of the dummy cell transistor DT is connected to a dummy word line DWL. Even in the configuration, the above embodiments can be applied, and it is only necessary that the threshold voltage difference be provided between the memory cell transistors MT0 and MT31 and the memory cell transistors MT1 to MT30. That is, it is only necessary that the threshold voltage difference be provided between the memory cell transistor which is adjacent to the selection transistor to act as the memory cell substantially retaining the data and other memory cell transistors. The number of dummy word lines is not limited to one, but two or more dummy word lines may be provided.

As described in FIG. 5, in the above embodiments, the self-boost is performed using all the memory cell transistors MT in the erase state. However, it is not always necessary to use all the memory cell transistors MT. For example, the word line WL(m+2) located on the selection gate line side may be set to 0 V with respect to the selected word line WLm. In this case, the potential at the local region is raised by the self-boost using only the memory cell transistors MTm, MT(m+1), and MT(m+3).

The one memory cell transistor MT retains the 16 levels (4 bit data) by way of example in the above embodiments. However, the memory cell transistor MT may retain the four levels (2 bit data) or eight levels (3 bit data). The case of V01<Vth0'<V01'in FIG. 4 is described in the above embodiments. However, the effect is obtained as long as Vth0 is smaller than Vth0'.

Some of applications in which the NAND-type flash memory described in the embodiments is used will be described below.

[Memory Card]

Figure 46:
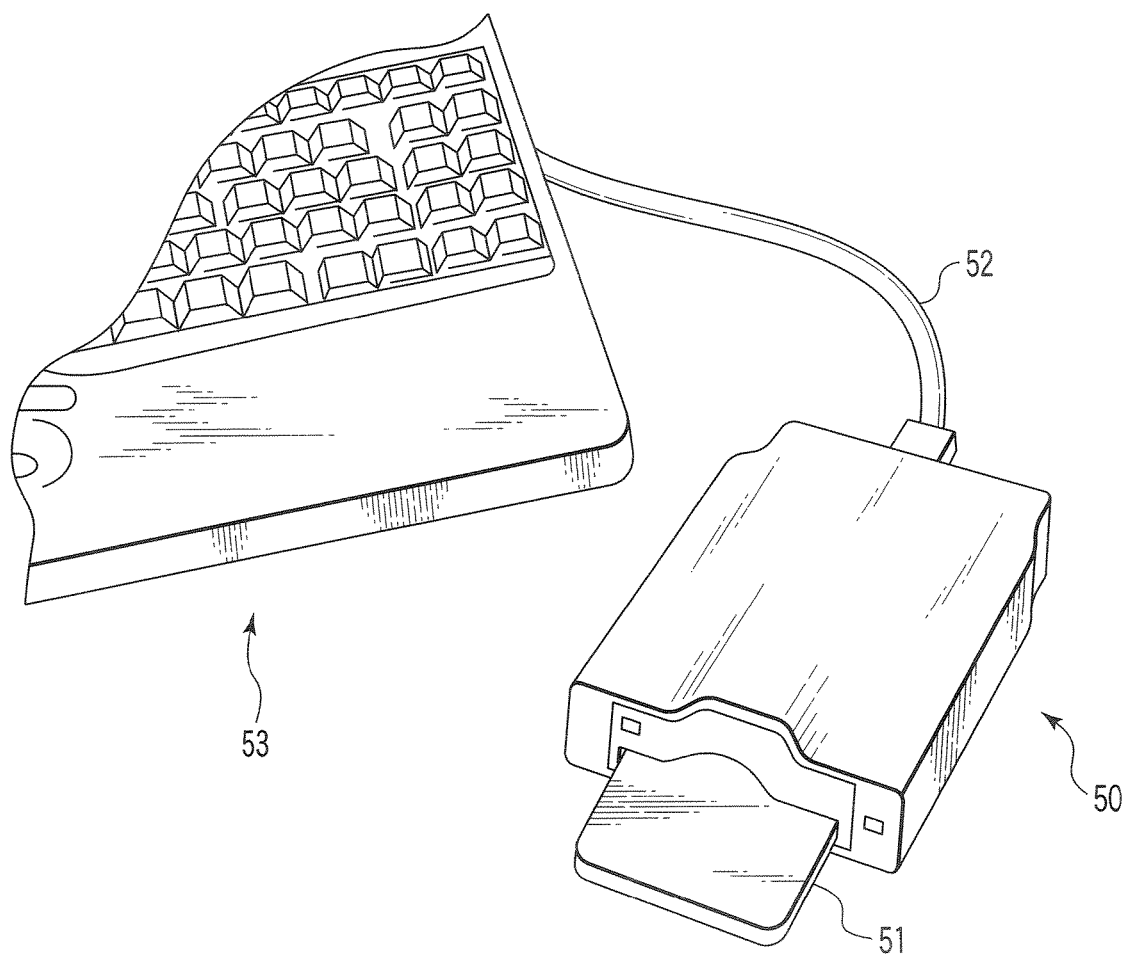
FIG. 46 is an external appearance view showing a memory card provided with the flash memory according to first to eleventh embodiments of the invention, a connection device, and a personal computer.

FIG. 46 is an external appearance view showing a personal computer, a memory card, and a memory card reader/writer. As shown in FIG. 46, a memory card 51 is inserted into a reader/writer 50. The reader/writer 50 is connected to a personal computer 53 through a connection cable 52. The memory card 51 includes the NAND-type flash memory 1 described in the embodiments. The personal computer 53 reads and writes the data from and in the memory card 51 with the reader/writer 50.

[USB Memory]

The flash memory 1 may be provided in a USB memory. The flash drive includes the NAND-type flash memory 1 described in the embodiments, and the flash drive is connected to a personal computer through a USB port.

[Portable Music Player]

The flash memory 1 may be mounted on a portable music player. The portable music player includes the NAND-type flash memory 1 described in the embodiments, and retains music data. The portable music player is connected to a personal computer through a connection cable or the like.

[IC card]

The flash memory 1 may be an IC card. FIG. 47 is an external view showing the IC card, and FIG. 48 is a block diagram showing the IC card. As shown in FIGS. 47 and 48, an IC card 60 includes an MCU 61 and a plane terminal 62. The MCU 61 includes a flash memory 63 and other circuits, e.g., ROM 64, RAM 65, and CPU 66. The flash memory 63 corresponds to the flash memory 1 described in the embodiments. The CPU 66 includes a control section 67 and a calculation section 68. The control section 67 controls the connection of each circuit block, and the calculation section 68 performs signal processing and the like.

The first to tenth embodiments can be applied to the above applications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    memory cell transistors each of which has a stacked gate including a charge accumulation layer and a control gate, and is configured to retain at least two levels of "0" data and "1" data according to a threshold voltage, the threshold voltage corresponding to the "0" data being the lowest threshold voltage in the levels retained by each of the memory cell transistors;
    a memory cell group in which current paths of the memory cell transistors are connected in series;
    a first selection transistor whose current path is connected in series to one of the memory cell transistors located closest to a source side in the memory cell group;
    word lines each of which is connected to the control gate of one of the memory cell transistors, upper limit values of threshold voltages of the memory cell transistors retaining the "0" data being different from one another in each word line; and
    a first selection gate line which is connected to a gate of the first selection transistor.

2. The device according to claim 1, wherein an upper limit value of a threshold voltage of one of the memory cell transistors which retains the "0" data and which is connected to one of the word lines adjacent to the first selection gate line is lower than a lower limit value of a threshold voltage of one of the memory cell transistors which retains the "0" data and which is connected to one of the word lines which is not adjacent to the first selection gate line.

3. The device according to claim 1, wherein a threshold voltage of one of the memory cell transistors which retains the "0" data and which is connected to one of the word lines adjacent to the first selection gate line has a negative value.

4. The device according to claim 2, further comprising a row decoder which applies a voltage to the word lines; and
    a well driver which applies a voltage to a semiconductor substrate on which the memory cell transistors are formed,
    wherein the well driver applies a positive voltage to the semiconductor substrate to collectively erase the data of the memory cell transistors, and the threshold voltages of the memory cell transistors is set in a value corresponding to the "0" data by injecting electrons into the charge accumulation layer after the erase.

5. The device according to claim 4, wherein the row decoder applies a first voltage to one of the word lines adjacent to the first selection gate line, and applies a second voltage higher than the first voltage to one of the word line which is not adjacent to the first selection gate line, when the threshold voltages of the memory cell transistors are set in the value corresponding to the "0".

6. The device according to claim 2, further comprising a row decoder which applies a voltage to the word lines; and
    a well driver which applies a voltage to a semiconductor substrate on which the memory cell transistors are formed,
    wherein the well driver applies a positive voltage to the semiconductor substrate to collectively erase the data of the memory cell transistors, and
    the row decoder sets the threshold voltages of the memory cell transistors in the value corresponding to the "0" data by changing the applied voltage according to the word line during the erase.

7. The device according to claim 6, wherein, during the erase, the row decoder applies a first voltage to one of the word lines adjacent to the first selection gate line, and applies a second voltage higher than the first voltage to one of the word lines which is not adjacent to the first selection gate line.

8. The device according to claim 2, further comprising a row decoder which applies a voltage to the word lines; and
    a well driver which applies a voltage to a semiconductor substrate on which the memory cell transistors are formed,
    wherein the well driver applies a positive voltage to the semiconductor substrate to collectively erase the data of the memory cell transistors, and
    in a data write operation, the row decoder sets the threshold voltage of one of the memory cell transistors in the value corresponding to the "0" data by injecting electrons into the charge accumulation layer.

9. The device according to claim 8, wherein the row decoder applies a first voltage to one of the word lines adjacent to the first selection gate line, and applies a second voltage higher than the first voltage to one of the word lines which is not adjacent to the first selection gate line, when the threshold voltage of one of the memory cell transistors is set in the value corresponding to the "0" data.

10. The device according to claim 2, wherein each of the memory cell transistors is configured to retain $2^n$ levels from "0" data to "$2^n-1$" data (n is a natural number),
    the threshold voltages of the memory cell transistors are increased in ascending order of the "0" data to "$2^n-1$" data, and
    upper limit values of the threshold voltages of the memory cell transistors each of which retains the "0" data to the "$2^n-2$" data and which is connected to one of the word lines which is not adjacent to the first selection gate line are equal to upper limit values of the threshold voltages of the memory cell transistors each of which retains the "1" data to the "$2^n-1$" data and which is connected to one of the word lines adjacent to the first selection gate line.

11. The device according to claim 2, wherein, in the memory cell transistors connected to the word lines which are not adjacent to the first selection gate line, the threshold voltage is set higher as the connected one of the words line is brought closer to the first selection gate line.

12. The device according to claim 2, further comprising a second selection transistor whose current path is connected in series to one of the memory cell transistor located closest to a drain side in the memory cell group; and
    a second selection gate line which is connected to gate of the second selection transistor,
    wherein an upper limit value of a threshold voltage of one of the memory cell transistors which retains the "0" data and which is connected to one of the word lines adjacent to the second selection gate line is lower than a lower limit value of a threshold voltage of one of the memory cell transistors which retains the "0" data and which is connected to one of the word lines which is not adjacent to the first and second selection gate lines.

13. A semiconductor memory device comprising:
a memory cell transistor which has a stacked gate including a charge accumulation layer and a control gate, is configured to retain $2^n$ levels from "0" data to "$2^n-1$" data (n is a natural number more than 1) according to a threshold voltage, the threshold voltages of the memory cell transistor being increased in ascending order of the "0" data to the "$2^n-1$" data;
a memory cell group in which current paths of the memory cell transistors are connected in series;
a selection transistor whose current path is connected in series to one of the memory cell transistors located closest to a source side in the memory cell group;
word lines which is connected to the control gate of one of the memory cell transistors, upper limit values of threshold voltages of the memory cell transistors retaining the "0" data being different from one another in each word line;
a selection gate line which is connected to a gate of the selection transistor; and
a control circuit which controls a data write operation to the memory cell transistors, the control circuit writing the data into the memory cell transistors connected commonly to one of the word lines, the control circuit writing the data into the memory cell transistors by a first write operation and a second write operation subsequent to the first write operation, the "$2^n-1$" data being written into one of the memory cell transistors in the first write operation, the data having the threshold voltage lower than that of the "$2^n-1$" data being written in the second write operation.

14. The device according to claim 13, wherein the control circuit performs the first and second write operations to the memory cell transistors connected to one of the word lines adjacent to the selection gate line.

15. The device according to claim 13, wherein an upper limit value of a threshold voltage of one of the memory cell transistors which retains the "0" data and which is connected to one of the word lines adjacent to the selection gate line is lower than a lower limit value of a threshold voltage of one of the memory cell transistors which retains the "0" data and which is connected to one of the word lines which is not adjacent to the selection gate line.

16. The device according to claim 15, wherein a threshold voltage of the memory cell transistors which retain the "0" data and which is connected to one of the word lines adjacent to the selection gate line has a negative value.

* * * * *